(12) United States Patent
Mori

(10) Patent No.: US 9,089,069 B2
(45) Date of Patent: Jul. 21, 2015

(54) ELECTRONIC APPARATUS

(71) Applicant: Panasonic Corporation, Kadoma-shi, Osaka (JP)

(72) Inventor: Takeshi Mori, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 143 days.

(21) Appl. No.: 13/933,955

(22) Filed: Jul. 2, 2013

(65) Prior Publication Data

US 2014/0285074 A1 Sep. 25, 2014

(30) Foreign Application Priority Data

Mar. 25, 2013 (JP) .................................. 2013-062022

(51) Int. Cl.
*H05K 5/00* (2006.01)
*H05K 7/18* (2006.01)
*H05K 5/06* (2006.01)
*G06F 1/16* (2006.01)

(52) U.S. Cl.
CPC .. *H05K 7/18* (2013.01); *G06F 1/16* (2013.01); *H05K 5/06* (2013.01)

(58) Field of Classification Search
CPC .......... H05K 1/00; H05K 3/284; H05K 1/141
USPC ....................................... 361/748; 312/223.2
See application file for complete search history.

(56) References Cited

U.S. PATENT DOCUMENTS

| | | | | |
|---|---|---|---|---|
| 7,936,566 | B2 * | 5/2011 | Shigyo et al. .................. | 361/752 |
| 8,213,182 | B2 * | 7/2012 | Aoki et al. ..................... | 361/752 |
| 8,775,710 | B1 * | 7/2014 | Miller et al. ................... | 710/303 |
| 2008/0259551 | A1 * | 10/2008 | Gavenda et al. .............. | 361/684 |
| 2009/0167124 | A1 * | 7/2009 | Lee et al. ..................... | 312/223.2 |
| 2012/0224334 | A1 * | 9/2012 | Liu ................................ | 361/748 |
| 2014/0063724 | A1 * | 3/2014 | Chen et al. .............. | 361/679.33 |
| 2014/0211401 | A1 * | 7/2014 | Lee et al. ................. | 361/679.31 |

FOREIGN PATENT DOCUMENTS

JP 2002-094270 3/2002

* cited by examiner

*Primary Examiner* — Forrest M Phillips
(74) *Attorney, Agent, or Firm* — Hamre, Schumann, Mueller & Larson, P.C.

(57) ABSTRACT

The frame 6 includes a top frame 6a, a reverse frame 6b, a right frame 6c, a left frame 6d, a front frame 6e, and a rear frame 6f which are separate components. The left frame 6d is moved in the direction of an arrow C to the front frame 6e and the rear frame 6f. Ribs provided at both end portions of the left frame 6d are inserted into ribs provided at end portions of the front frame 6e and the rear frame 6f. Similarly, the right frame 6c is also moved, and ribs are inserted into each other. In this manner, the four side frames are assembled. Then, the top frame 6a and the reverse frame 6b are assembled thereto. Since the ribs are inserted into each other as described above, the frame 6 is easily assembled and has excellent robustness.

7 Claims, 19 Drawing Sheets

ELECTRONIC APPARATUS

BACKGROUND

1. Field

The present disclosure relates to an electronic apparatus having excellent casing assemblability.

2. Description of the Related Art

As a document regarding a casing of an electronic apparatus, there is Japanese Laid-Open Patent Publication No. 2002-094270. Japanese Laid-Open Patent Publication No. 2002-094270 discloses a technology in which, in assembling an additional cabinet to be added onto a base cabinet, an additional L-shaped side plate covering a left side surface and a back surface is fixed to the base cabinet by means of screws, an additional side-surface support plate is fixed to the additional L-shaped side plate by means of screws, an upper end portion of the additional side-surface support plate and an upper end portion of a side portion of the additional L-shaped side plate are connected to each other via an additional beam by means of screws, and then an additional side plate is fixed to the additional beam by means of screws.

SUMMARY

The present disclosure provides an electronic apparatus including a casing that is easily assembled and has excellent robustness after being assembled.

An electronic apparatus according to the present disclosure includes: a first plate; a second plate facing the first plate so as to be spaced apart therefrom in a first direction; and a plurality of frames arranged between the first plate and the second plate to form a side surface. Each frame includes a plurality of ribs, and the ribs of each frame are arranged so as to overlap in the first direction alternately with the ribs of another frame adjacent to the frame.

According to the electronic apparatus of the present disclosure, with the above configuration, it is possible to decrease the thickness and the weight of a casing that is easily assembled and has excellent robustness after being assembled.

DETAILED DESCRIPTION

Hereinafter, embodiments will be described in detail with reference to the drawings as appropriate. However, there will be instances in which detailed description beyond what is necessary is omitted. For example, detailed description of subject matter that is previously well-known, as well as redundant description of components that are substantially the same will in some cases be omitted. This is to prevent the following description from being unnecessarily lengthy, in order to facilitate understanding by a person of ordinary skill in the art.

The inventor provides the following description and the accompanying drawings in order to allow a person of ordinary skill in the art to sufficiently understand the present disclosure, and the description and the drawings are not intended to restrict the subject matter of the scope of the patent claims.

Hereinafter, a description will be given with, as an example of an embodiment, a portable computer (PC) in which a display panel called a clamshell type and an operation casing are rotatably engaged with each other.

[Configuration of Portable Computer]

Figure 1:
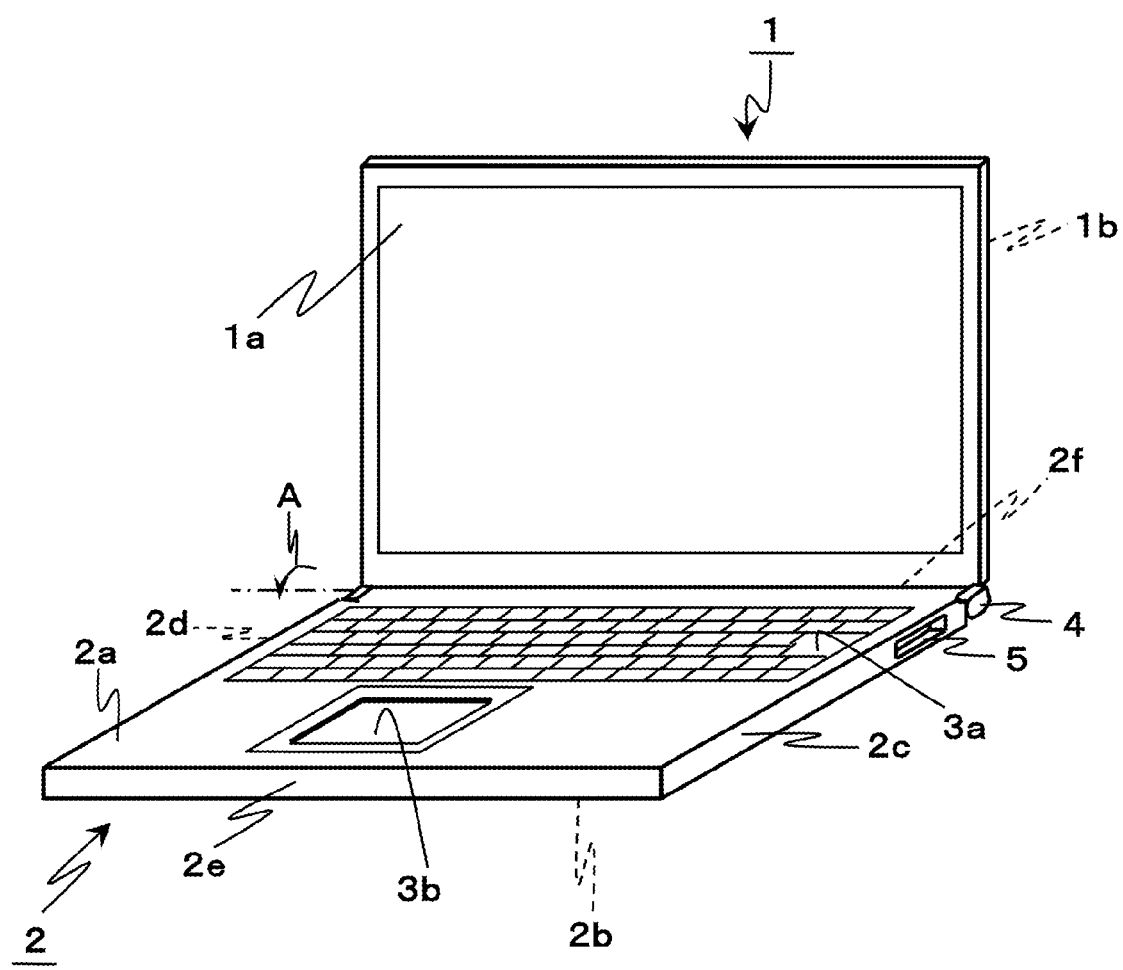
FIG. 1 is a perspective view of a portable computer (PC) in its opened state.
Figure 2:
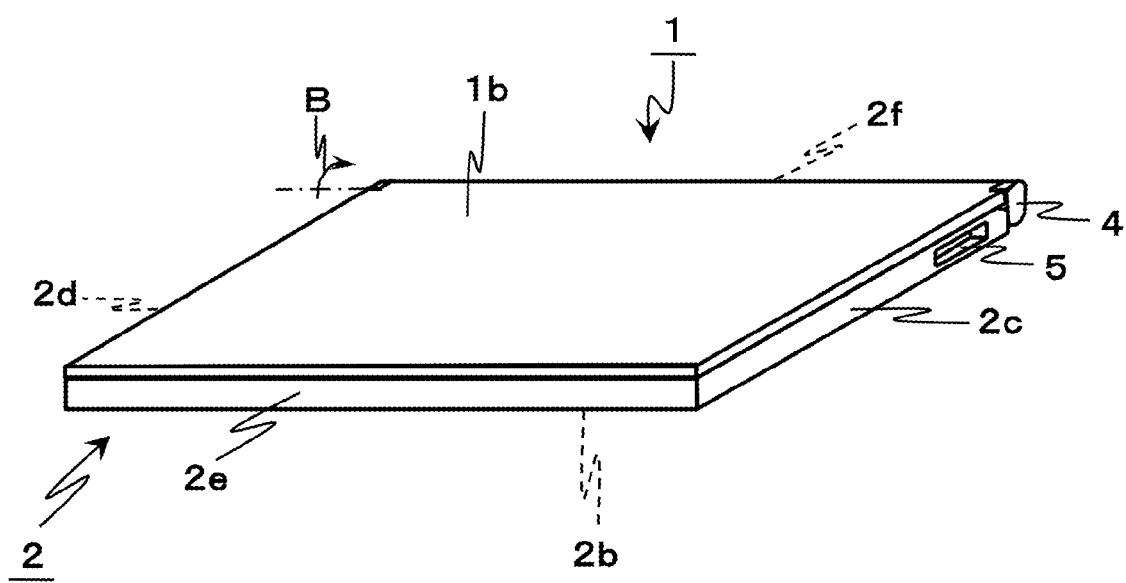
FIG. 2 is a perspective view of the PC in its closed state.

FIGS. 1 and 2 are perspective views of the PC. The PC has a configuration in which a display casing 1 and an operation casing 2 are supported with a hinge 4 in such a manner that the display casing 1 and the operation casing 2 are freely opened and closed. FIG. 1 shows an opened state where the display casing 1 is opened with respect to the operation casing 2. FIG. 2 shows a closed state where the display casing 1 is closed with respect to the operation casing 2. In shifting from the opened state of FIG. 1 to the closed state of FIG. 2, the user causes an opening/closing shaft of the hinge 4 to rotate in the direction of an arrow A. In addition, in shifting from the closed state to the opened state, the user causes the opening/closing shaft of the hinge 4 to rotate in the direction of an arrow B.

In the display casing 1, a display panel 1a and a back surface 1b that is on the reverse side of the display panel 1a are arranged. The operation casing 2 has a top surface 2a on which a keyboard 3a and an operation pad 3b are arranged; a reverse surface 2b on the reverse side of the top surface 2a; a front side surface 2e facing the user side in the state of FIG. 1 in which the user is allowed to view the display panel 1a; a rear side surface 2f opposed to the front side surface 2e across the keyboard 3a and the operation pad 3b; a right side surface 2c on the right side of the user; and a left side surface 2d on the left side of the user.

In addition, a connector 5 is disposed in the right side surface 2c of the operation casing 2 and near the rear side surface 2f. In the present embodiment, a case is shown in which the connector 5 is disposed in the right side surface 2c and on the rear side surface 2f side. However, the connector 5 may be disposed in the left side surface 2h, the front side surface 2e, or the rear side surface 2f. In addition, the connector 5 is connectable to a cable that is connected to an external apparatus.

(Embodiment 1)

[Configuration of Operation Casing]

FIGS. 3A to 3D show an example of an assembling process in the operation casing 2. In the operation casing 2 according to the present embodiment, the outer periphery of a frame 6 is covered with an outer covering. The frame 6 includes a top frame 6a, a reverse frame 6b, a right frame 6c, a left frame 6d, a front frame 6e, and a rear frame 6f. These frames are separate components. In other words, the top surface 2a is provided as an outer covering at a top surface of the top frame 6a; the reverse surface 2b is provided as an outer covering at a reverse surface of the reverse frame 6b; the right side surface 2c is provided as an outer covering at a right surface of the right frame 6c; the left side surface 2d is provided as an outer covering at a left surface of the left frame 6d; the front side surface 2e is provided as an outer covering at a front side of the front frame 6e; and the rear side surface 2f is provided as an outer covering at a rear side of the rear frame 6f. It should be noted that the surface of the frame 6 itself may be an outer covering.

Figure 3A:
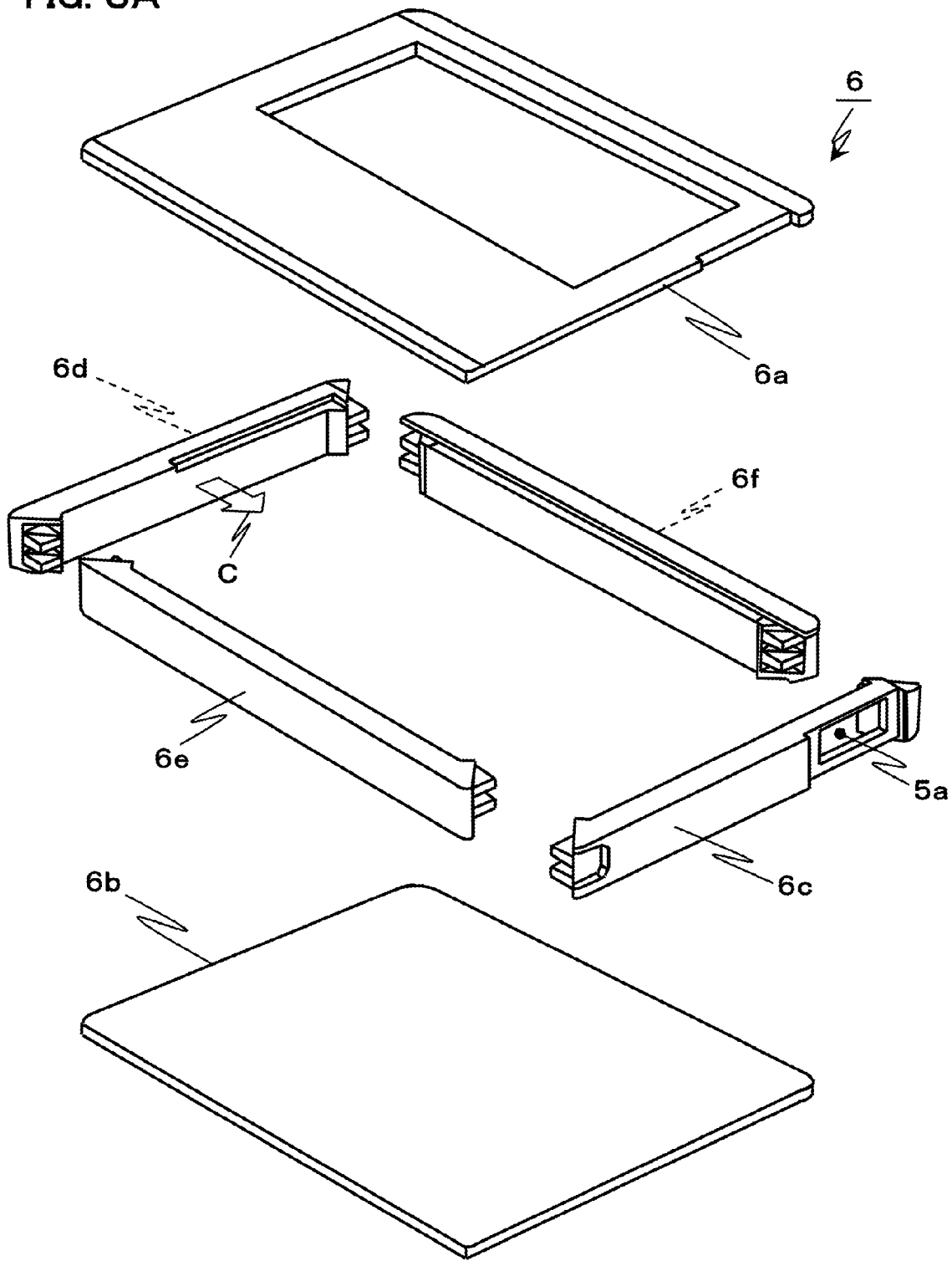
FIG. 3A is an exploded perspective view of side frames in an operation casing of the PC.

An example of assembling of the right frame 6c, the left frame 6d, the front frame 6e, and the rear frame 6f of the frame 6 will be described. First, the front frame 6e and the rear frame 6f are arranged parallel to each other so as to be spaced apart from each other by a distance equal to the length of the left frame 6d. In this state, as shown in FIG. 3A, the left frame 6d is moved in the direction of an arrow C, and one end portion of the left frame 6d is inserted into one end portion of the front frame 6e. Similarly, the other end portion of the left frame 6d is inserted into one end portion of the rear frame 6f.

Figure 3B:
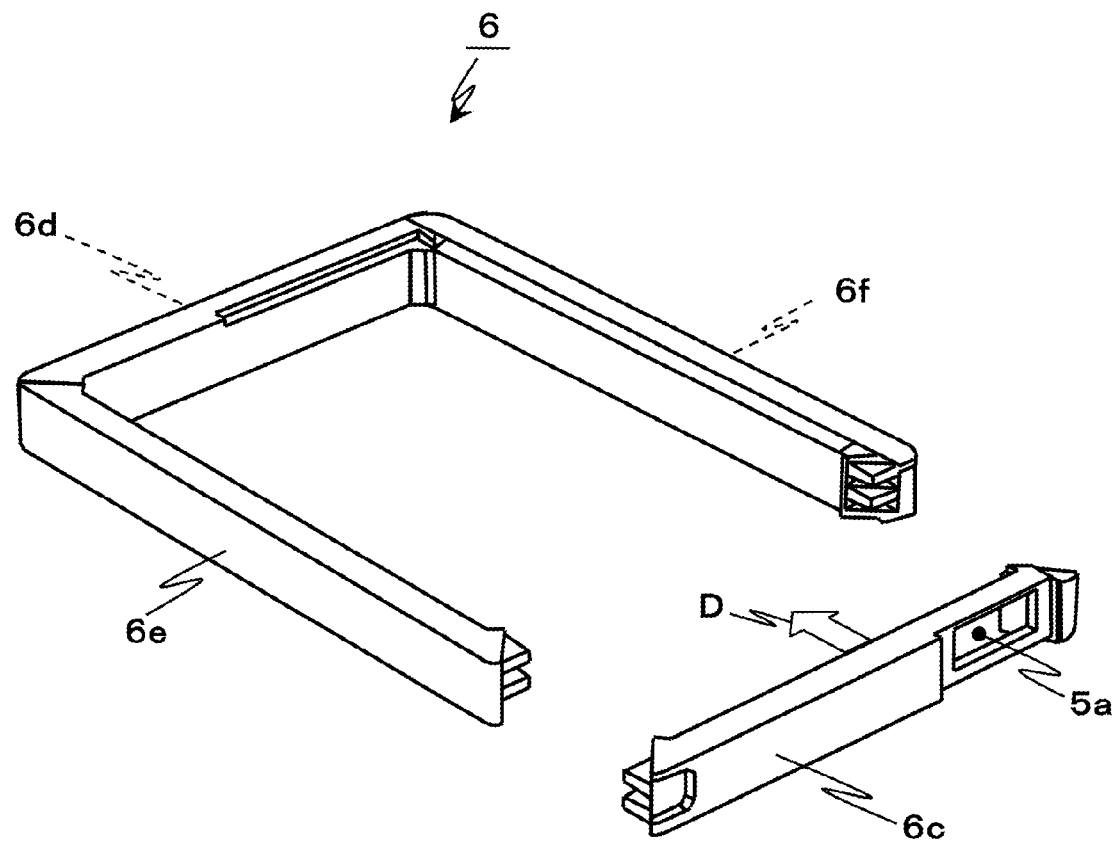
FIG. 3B is an exploded perspective view of the side frames in the operation casing of the PC in a process of assembling.

Next, the right frame 6c is inserted into the front frame 6e and the rear frame 6f into which the left frame 6d has been inserted. In other words, as shown in FIG. 3B, one end portion of the right frame 6c is inserted into the other end portion of the front frame 6e. Similarly, the other end portion of the right frame 6c is inserted into the other end portion of the rear frame 6f. In this manner, as shown in FIG. 3C, it is possible to assemble the four components (6c, 6d, 6e, and 6f) corresponding to four side portions (2c, 2d, 2e, and 2f) in the operation casing 2.

It should be noted that in the above-described assembling process, ribs are provided at the end portions of the four separate components supporting the respective side portions of the frame 6, and, at each of the corners between the four components, the ribs are engaged with each other so as to face each other in an up-down direction. The adjacent components at each corner are inserted into each other such that the ribs are engaged with each other in the up-down direction as shown in FIGS. 3B and 3C. Therefore, the frame 6 shown in FIG. 3C is allowed to have resistance to torsion applied in the up-down direction and resistance to disengagement of the inserted portion, since the side surfaces of the ribs at each of the corners between the four components interfere with each other.

Figure 3C:
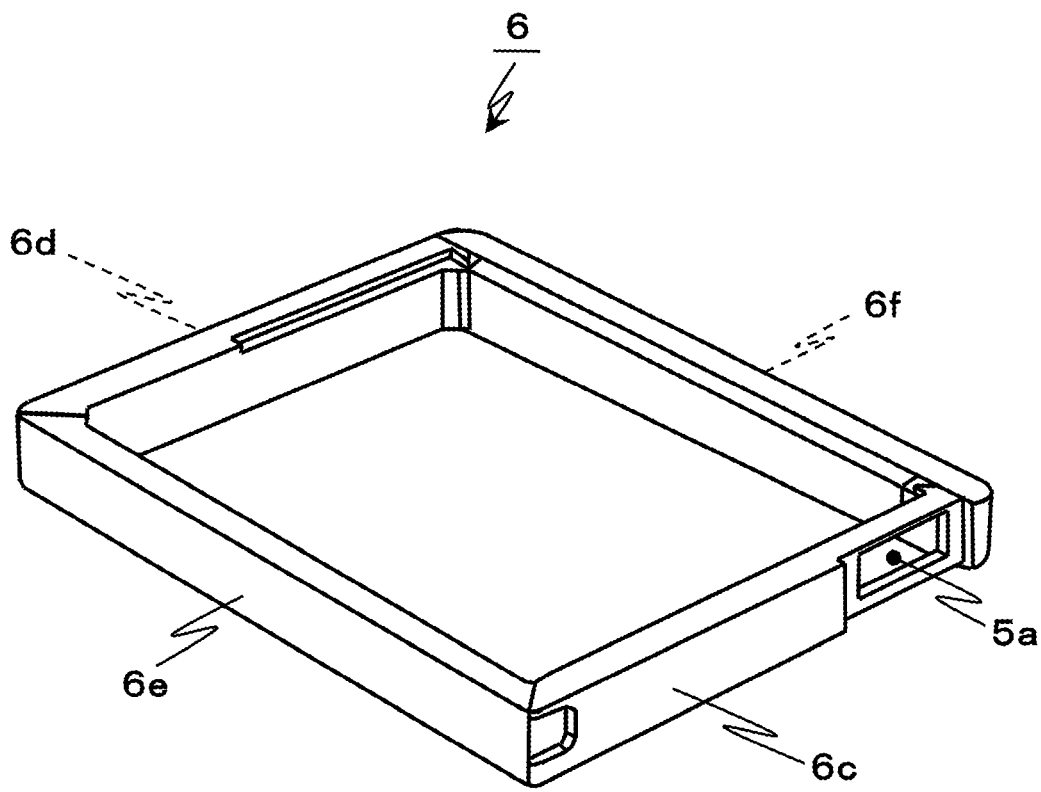
FIG. 3C is a perspective view of the assembled side frames in the operation casing of the PC.
Figure 3D:
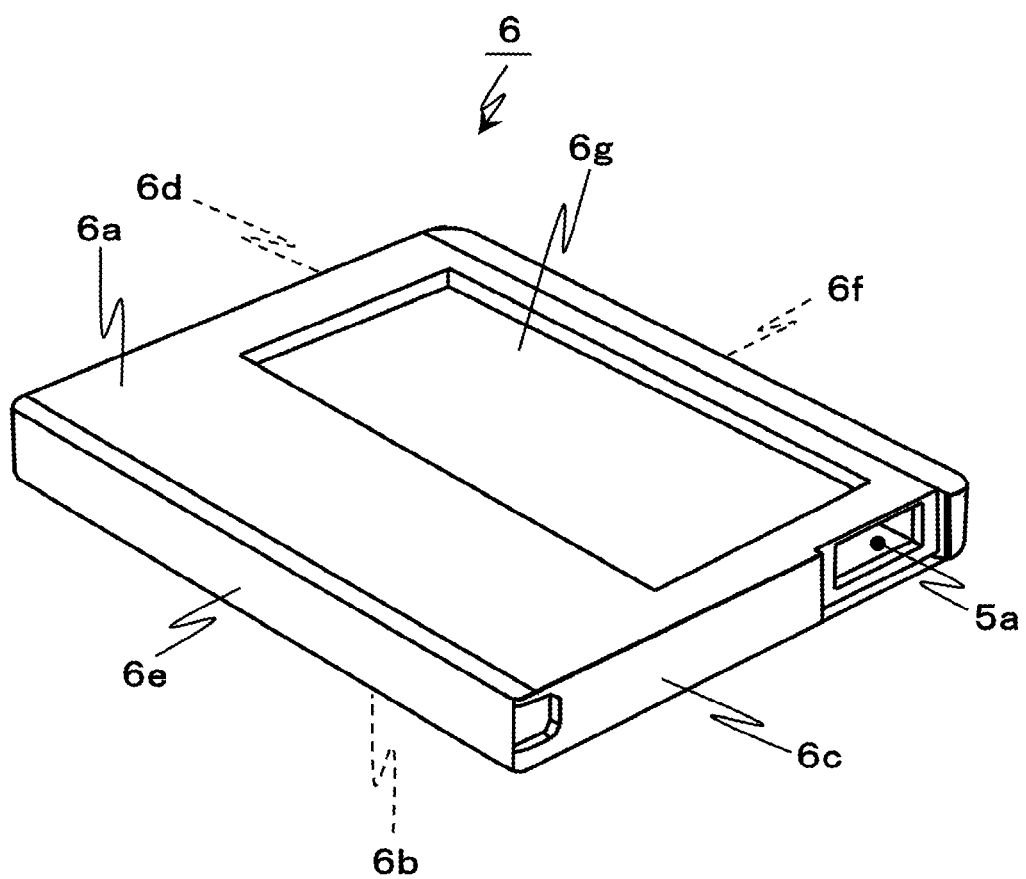
FIG. 3D is a perspective view of a frame in the operation casing of the PC.

After the four components supporting the side portions are assembled as shown in FIG. 3C as described above, the top frame 6a and the reverse frame 6b are fitted to the four components, thereby obtaining the frame 6 in FIG. 3D. It should be noted that a recess 6g provided in the top frame 6a is a bottomed recess into which the keyboard 3a is to be inserted. Since the top frame 6a and the reverse frame 6b are engaged with the upper and lower surfaces of the four components (6c, 6d, 6e, and 6f) as described above, the strength of the fitted top frame 6a and reverse frame 6b is added to the four components, and thus it is possible to enhance the strength of the frame 6 against torsion applied in the up-down direction.

[Fixing of Side Frames]

Figure 4A:
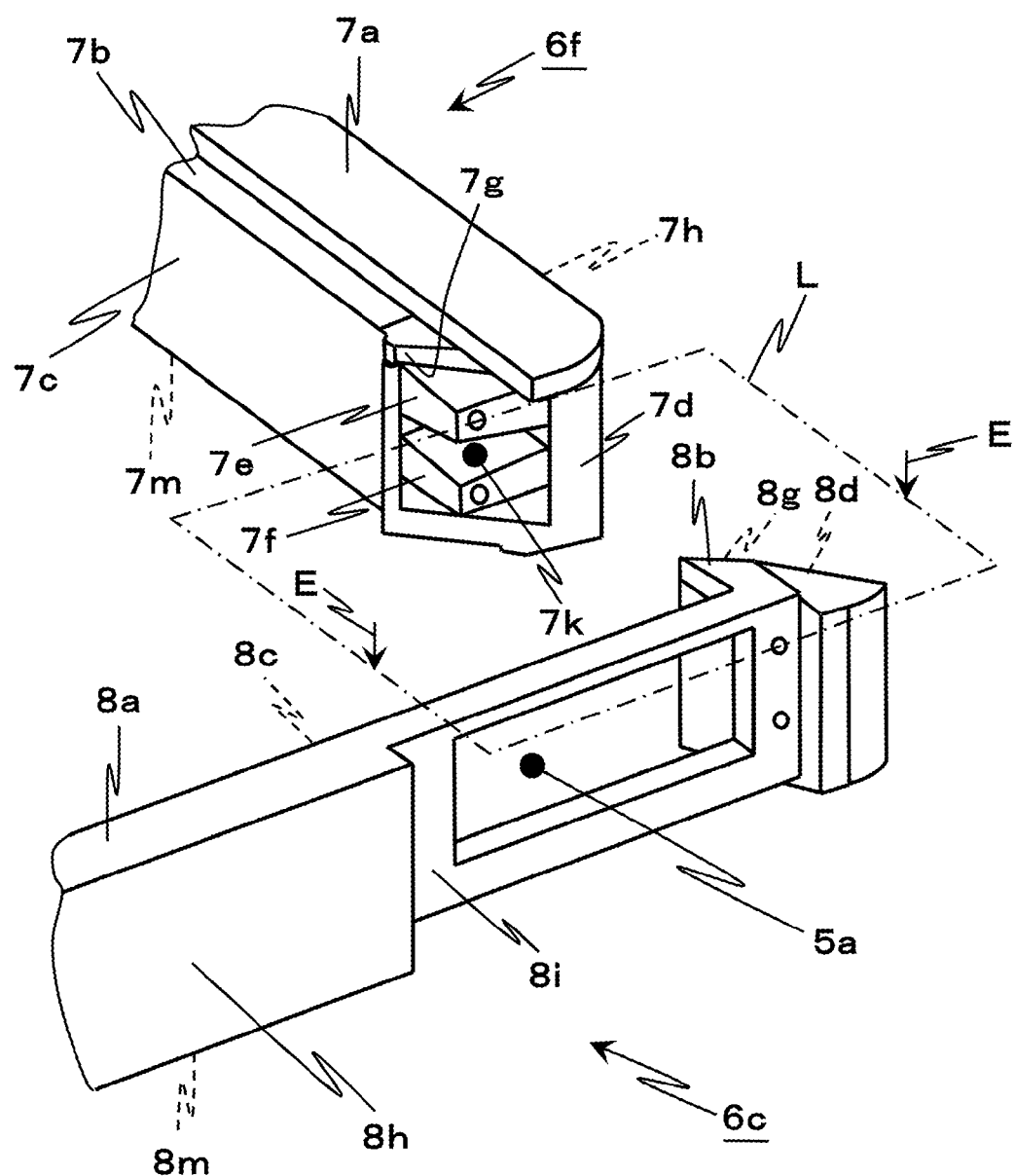
FIG. 4A is a principal part perspective view of the side frames in the operation casing of the PC prior to assembling.
Figure 4B:
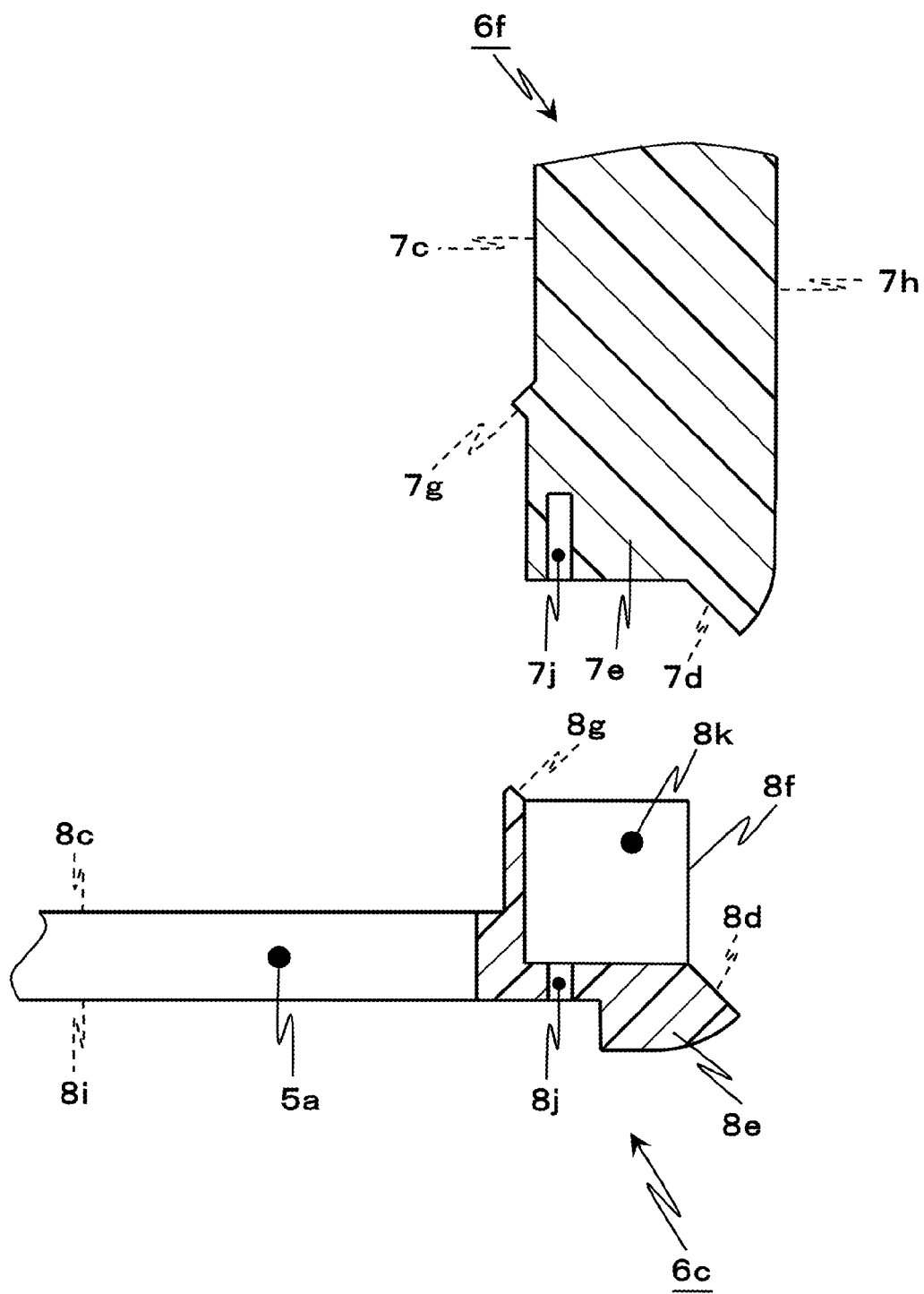
FIG. 4B is a principal part cross-sectional view of the side frames in the operation casing of the PC prior to assembling.
Figure 4C:
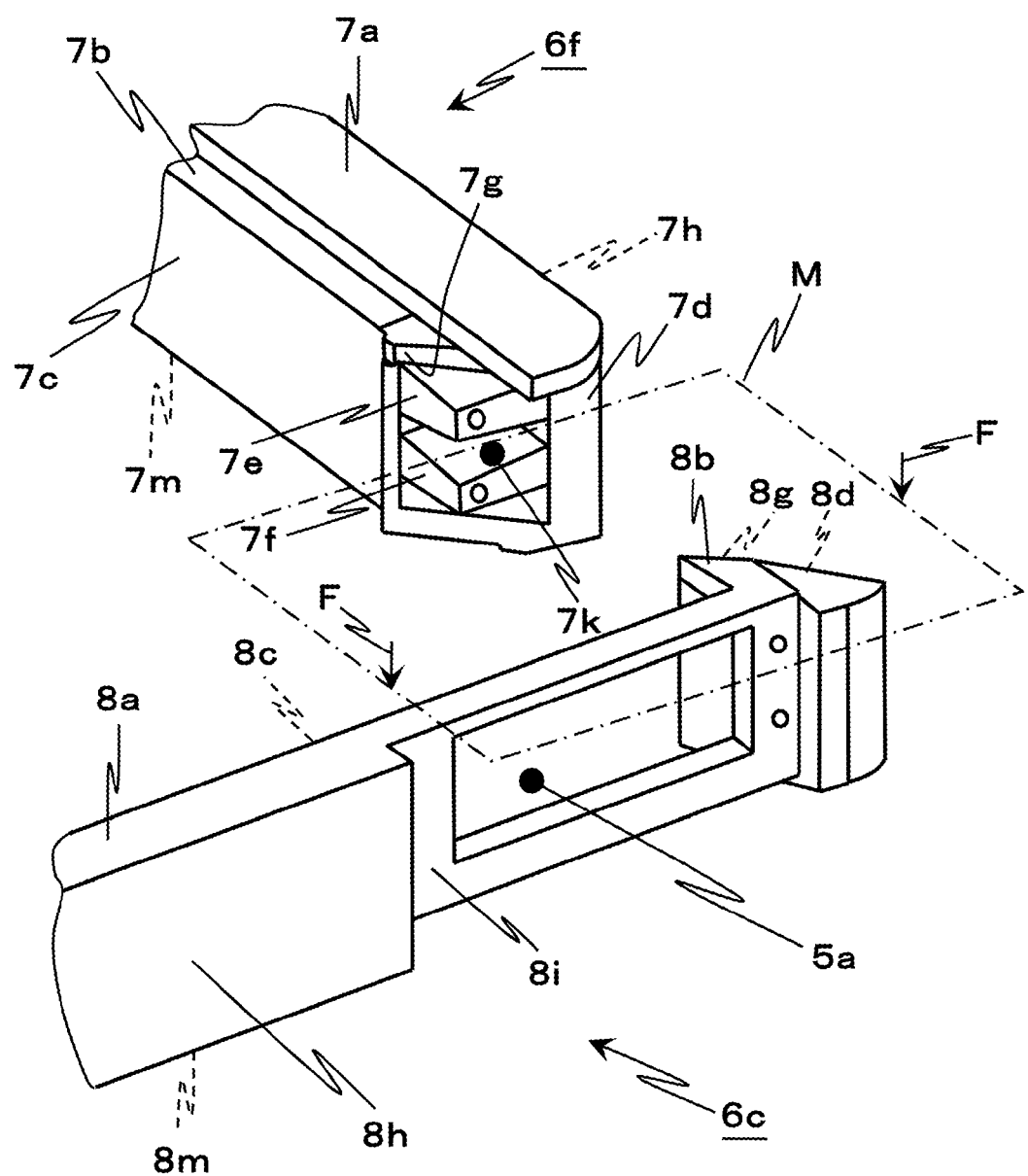
FIG. 4C is a principal part perspective view of the side frames in the operation casing of the PC prior to assembling.
Figure 4D:
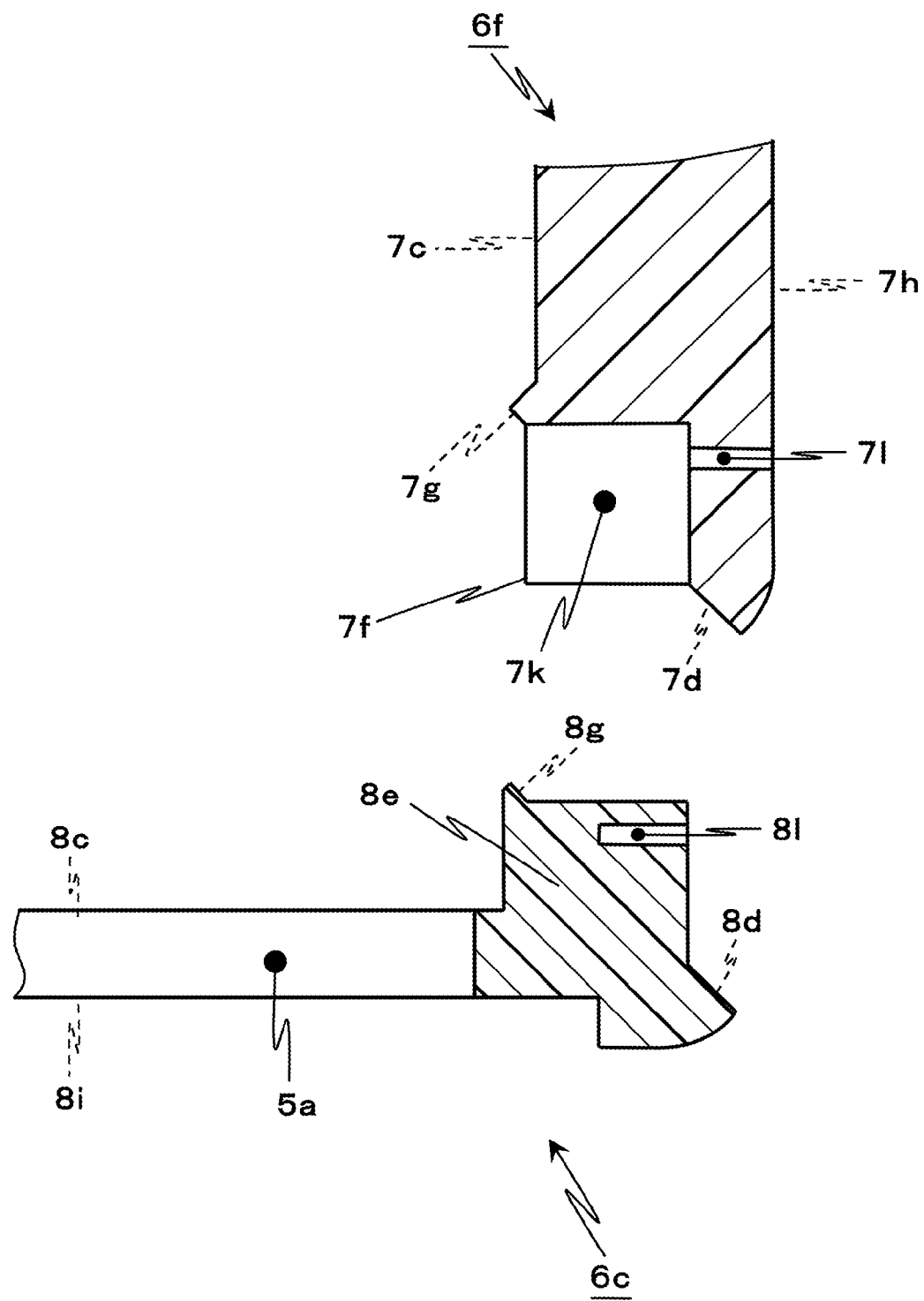
FIG. 4D is a principal part cross-sectional view of the side frames in the operation casing of the PC prior to assembling.

At each of the corners between the four components (6c, 6d, 6e, and 6f) corresponding to the four side portions (2c, 2d, 2e, and 2f), the ribs are alternately arranged at different heights. An example where each rib and the surface on which a rib adjacent to the rib is provided are secured to each other at each corner by means of screws from directions perpendicular to each other is shown in FIGS. 4A and 4C. FIGS. 4A and 4C each are an enlarged perspective view of the corner between the right frame 6c and the rear frame 6f as an example. FIG. 4B is a cross-sectional view taken along a plane L in FIG. 4A, as seen from arrows E. FIG. 4D is a cross-sectional view taken along a plane M in FIG. 4B, as seen from arrows F.

The rear frame 6f has a rear frame top surface 7a, a rear frame flat surface 7b, a rear frame inner surface 7c, a rear frame end surface 7d, a rear frame outer surface 7h, and a rear frame reverse surface 7m. The rear frame end surface 7d includes a rear frame upper rib 7e, a rear frame lower rib 7f, a rear frame projection end surface 7g, rear frame screw holes 7j, a rear frame gap 7k, and rear frame screw holes 7l. The rear frame end surface 7d has an inclined surface that is obtained by cutting the rear frame 6f at the corner and is closer to the right frame 6c at the rear frame outer surface 7h side than at the rear frame inner surface 7c side. The rear frame projection end surface 7g constitutes a part of the inclined surface. In addition, the rear frame upper rib 7e and the rear frame lower rib 7f include projections extending from the rear frame projection end surface 7g toward the right frame 6c side. In addition, the surfaces of the rear frame upper rib 7e and the rear frame lower rib 7f on the right frame 6c side are formed parallel to a right frame outer surface 8h of the right frame 6c. In addition, the surfaces of the rear frame upper rib 7e and the rear frame lower rib 7f on the front frame 6e side are formed parallel to the rear frame outer surface 7h of the rear frame 6f. Moreover, the rear frame top surface 7a includes a projection extending further than the rear frame end surface 7d at the corner. It should be noted that as shown in FIG. 3A, the corner between the rear frame 6f and the left frame 6d and both corners between the front frame 6e and the left frame 6d and the right frame 6c also have the same configuration as in FIGS. 4A and 4C.

The right frame 6c has a right frame top surface 8a, a right frame flat surface 8b, a right frame inner surface 8c, a right frame end surface 8d, the right frame outer surface 8h, a right frame step surface 8i, and a right frame reverse surface 8m. The right frame end surface 8d includes a right frame upper rib 8e, a right frame lower rib 8f, a right frame projection end surface 8g, right frame screw holes 8j, a right frame gap 8k, and right frame screw holes 8l. The right frame end surface 8d has an inclined surface that is obtained by cutting the right frame 6c at the corner and is closer to the rear frame 6f at the right frame outer surface 8h side than at the right frame inner surface 8c side. The right frame projection end surface 8g constitutes a part of the inclined surface. In addition, the right frame upper rib 8e and the right frame lower rib 8f include projections extending from the right frame projection end surface 8g toward the rear frame 6f side. The surfaces of the right frame upper rib 8e and the right frame lower rib 8f on the rear frame 6f side are formed parallel to the rear frame outer surface 7h of the rear frame 6f. The surfaces of the right frame upper rib 8e and the right frame lower rib 8f on the right frame 6c side are formed parallel to the right frame outer surface 8h of the right frame 6c. Moreover, the right frame top surface 8a includes a projection extending further than the right frame end surface 8d at the corner. The right frame step surface 8i is recessed from the right frame outer surface 8h toward the left frame 6d side since a window 5a at which the connector 5 is to be mounted is provided in the right frame step surface 8i. Therefore, in the case where the right frame 6c does not have a through hole such as the window 5a, the right frame step surface 8i may be omitted and a surface may be provided therein so as to be flush with the right frame outer surface 8h. It should be noted that as shown in FIG. 3A, the corner between the right frame 6c and the front frame 6e and both corners between the left frame 6d and the front frame 6e and the rear frame 6f also have the same configuration as in FIGS. 4A and 4C.

The right frame 6c and the rear frame 6f configured thus are secured to each other at the corner by means of screws 9 and 10 (see FIG. 5B) in directions perpendicular to the right frame 6c and the rear frame 6f. In other words, as shown in FIG. 4B, the screws 9 extend through the right frame screw holes 8j of the right frame 6c and are screwed into the rear frame screw holes 7j of the rear frame 6f, thereby securing each component. In addition, as shown in FIG. 4D, the screws 10 extend through the rear frame screw holes 7l of the rear frame 6f and are screwed into the right frame screw holes 8l of the right frame 6c, thereby securing each component.

Next, a configuration will be described in which the rear frame upper rib 7e and the rear frame lower rib 7f of the rear frame 6f and the right frame upper rib 8e and the right frame lower rib 8f of the right frame 6c are fitted together. It should be noted that the configurations of the rear frame lower rib 7f and the right frame lower rib 8f are substantially the same as those of the rear frame upper rib 7e and the right frame upper rib 8e, and thus the description thereof is omitted.

As shown in FIG. 4B, the rear frame upper rib 7e of the rear frame 6f is inserted into the right frame gap 8k between the right frame upper rib 8e and the right frame lower rib 8f at the corner. At that time, the rear frame projection end surface 7g comes into contact with the right frame projection end surface 8g. In addition, the rear frame end surface 7d comes into contact with the right frame end surface 8d. As a result, the rear frame upper rib 7e is fitted into the right frame gap 8k between the right frame upper rib 8e and the right frame lower rib 8f.

As shown in FIG. 4D, the right frame upper rib 8e of the right frame 6c is inserted into the rear frame gap 7k between the rear frame upper rib 7e and the rear frame lower rib 7f at the corner. At that time, the rear frame projection end surface 7g comes into contact with the right frame projection end surface 8g. In addition, the rear frame end surface 7d comes into contact with the right frame end surface 8d. As a result, the right frame upper rib 8e is fitted into the rear frame gap 7k between the rear frame upper rib 7e and the rear frame lower rib 7f.

In the present embodiment, each of the right frame upper rib 8e and the right frame lower rib 8f is formed in such a tapered shape that the thickness is large on the right frame outer surface 8h side and the right frame end surface 8d side in the right frame 6c and is decreased with increasing distance from the right frame outer surface 8h and the right frame end surface 8d. In addition, each of the rear frame upper rib 7e and the rear frame lower rib 7f is formed in such a tapered shape that the thickness is large on the rear frame outer surface 7h side and the rear frame end surface 7d side in the rear frame 6f and is decreased with increasing distance from the rear frame outer surface 7h and the rear frame end surface 7d. It should be noted that in each rib, the thick portion is referred to as "base portion", and the thin portion is referred to as "end portion". In addition, in the present embodiment, the distance between the base portion of the right frame upper rib 8e and the base portion of the right frame lower rib 8f is equal to the thickness of the end portion of the rear frame upper rib 7e. Moreover, the distance between the base portion of the rear frame upper rib 7e and the base portion of the rear frame lower rib 7f is equal to the thickness of the end portion of the right frame upper rib 8e. In other words, the end portion of the rear frame upper rib 7e is fitted between the base portions of the right frame upper rib 8e and the right frame lower rib 8f. At the same time, the end portion of the right frame upper rib 8e is fitted between the base portions of the rear frame upper rib 7e and the rear frame lower rib 7f. Therefore, it is possible to fit each of the end portions of the adjacent ribs between the base portions, and it is possible to increase the surface area where the ribs slide relative to each other at the corner. As a result, it is possible to enhance the strength of the frame 6 assembled through fitting of the ribs and resistance of the frame 6 to disengagement of the inserted portion. In addition, in inserting the ribs into each other at the corner, the gap between the ribs is wide at the beginning of the insertion and is gradually narrowed due to the tapered shape of each rib as the insertion advances. Thus, it is easy to insert the ribs into each other, and it is possible to easily perform the assembling. It should be noted that each rib of the present embodiment has a tapered shape as described above, but the interval between the base portions and the interval between the end portions may be the same.

It should be noted that when the rear frame 6f and the right frame 6c are assembled at the corner, the right frame end surface 8d at the right frame upper rib 8e comes into contact with the rear frame end surface 7d at the rear frame upper rib 7e as shown in FIG. 4B. At the same time, the right frame projection end surface 8g at the right frame gap 8k comes into contact with the rear frame projection end surface 7g at the rear frame upper rib 7e. As a result, the right frame screw holes 8j at the right frame gap 8k are positioned so as to correspond to the rear frame screw holes 7j of the rear frame upper rib 7e. Therefore, it is possible to secure the rear frame 6f and the right frame 6c to each other by means of the screws 9. In addition, as shown in FIG. 4D, the rear frame end surface 7d at the rear frame upper rib 7e comes into contact with the right frame end surface 8d at the right frame upper rib 8e. At the same time, the rear frame projection end surface 7g at the rear frame gap 7k comes into contact with the right frame projection end surface 8g at the right frame upper rib 8e. As a result, the rear frame screw holes 7l at the rear frame gap 7k are positioned so as to correspond to the right frame screw holes 8l at the right frame upper rib 8e. Thus, it is possible to secure the right frame 6c and the rear frame 6f to each other by means of the screws 10. In other words, the right frame 6c and the rear frame 6f are secured to each other at the corner by means of the screws from the directions perpendicular to each other and are firmly fitted together.

It should be noted that although the insertion of the ribs at one corner and securing of the frames at the corner with the screws from the directions perpendicular to each other have been described above, it is also possible to similarly secure the frames to each other at all the corners by means of screws. Through the simple assembling of inserting the ribs of the right frame 6c, the left frame 6d, the front frame 6e, and the rear frame 6f into each other as described above, it is possible to enhance the strength at the side surfaces of the frame 6. As a result, it is possible to provide sufficient mechanical robustness to the frame 6, regardless of the size of the surface area of the top frame 6a and/or the reverse frame 6b, presence/absence of an included heavy component, or the like. In addition, it is possible to form the top frame 6a and/or the reverse frame 6b into a thin plate shape. Thus, it is possible to form the top frame 6a or the reverse frame 6b into a thin plate shape by a simple method such as press molding, and hence it is also possible to decrease the weight of the frame 6. Moreover, since the frames are secured to each other at all the corners by means of screws from the directions perpendicular to each other, it is possible to ensure sufficient water-sealing performance of the frame 6. It should be noted that assembling of the top frame 6a and the reverse frame 6b to the right frame 6c, the left frame 6d, the front frame 6e, and the rear frame 6f will be described later. In addition, in the present embodiment, at the corner, the rear frame 6f is secured to the right frame 6c by means of the screws 9 in the direction perpendicular to the right frame outer surface 8h of the right frame 6c, and the right frame 6c is secured to the rear frame 6f by means of the screws 10 in the direction perpendicular to the rear frame outer surface 7h of the rear frame 6f. However, this is merely one example, and the rear frame 6f may be secured to the right frame 6c by means of the screws 9 that are, for example, parallel to the rear frame 6f and inclined in the direction toward the right frame top surface 8a.

[Water Sealing of Frame]

Figure 5A:
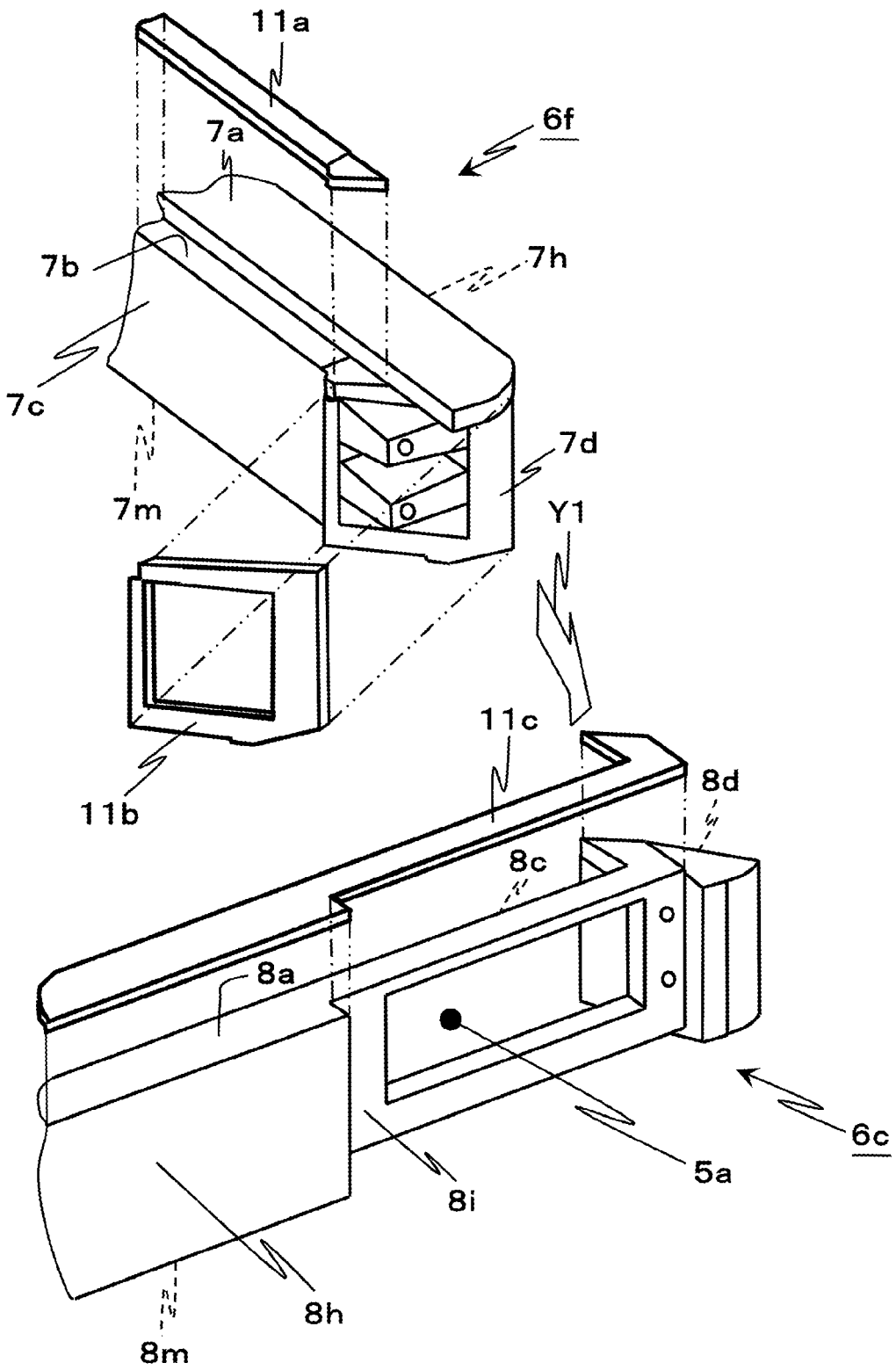
FIG. 5A is a principal part perspective view of the side frames in the operation casing of the PC prior to assembling.
Figure 5B:
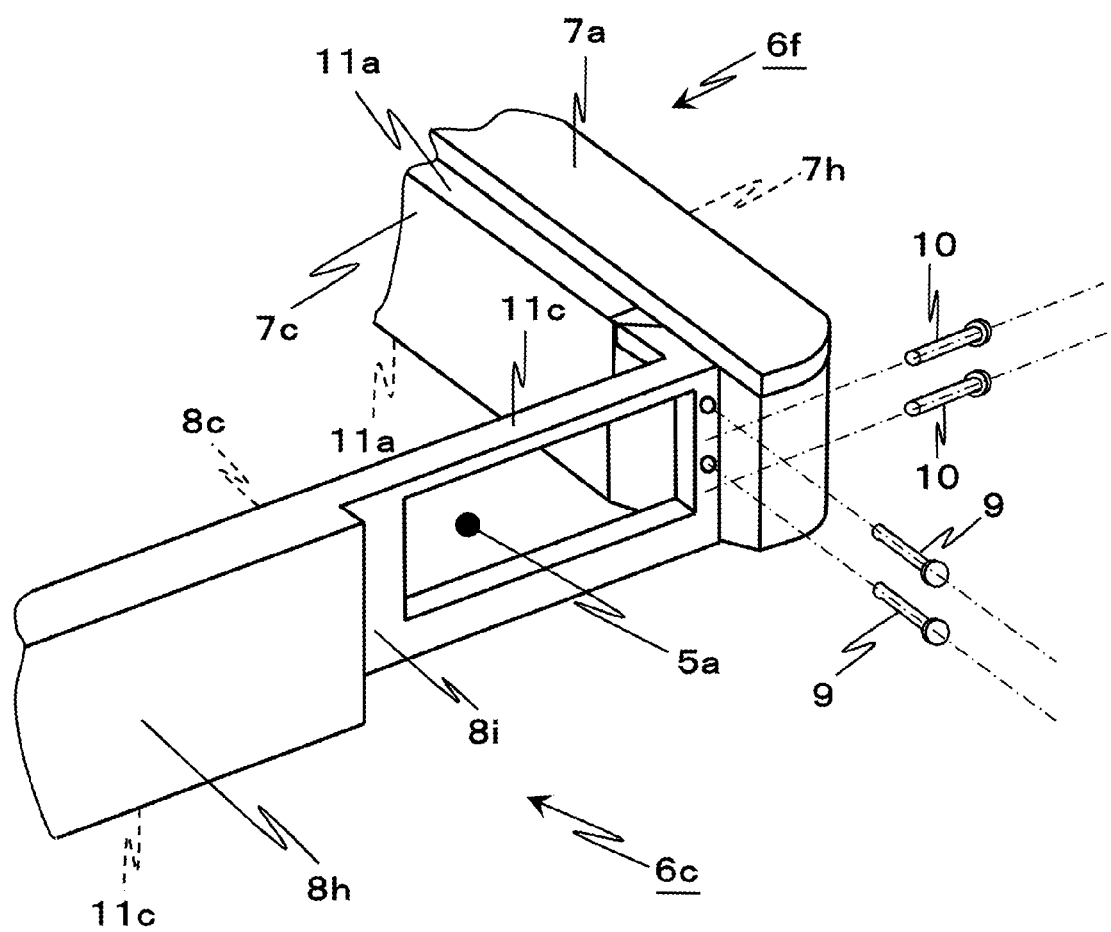
FIG. 5B is a principal part perspective view of the side frames in the operation casing of the PC in a process of assembling.
Figure 5C:
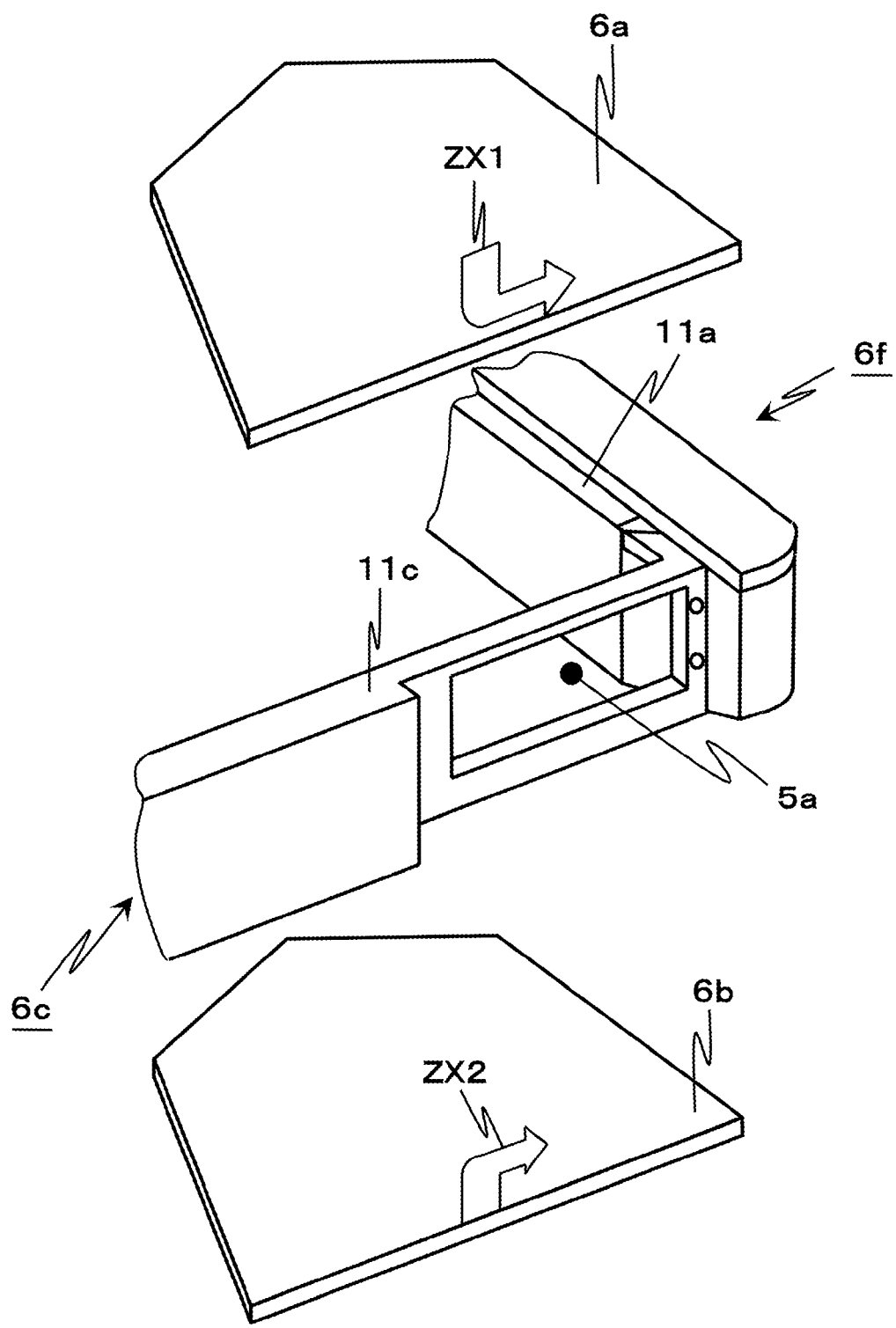
FIG. 5C is a principal part perspective view of the side frames in the operation casing of the PC in the process of assembling.

FIGS. 5A to 5C are perspective views showing an example of a water-sealing structure. The right frame 6c and the rear frame 6f in FIGS. 5A to 5C have the same configuration as described above. A rear frame flat surface water-sealing component 11a is arranged on the rear frame flat surface 7b. It should be noted that the rear frame reverse surface 7m similarly includes a flat surface, and a rear frame flat surface water-sealing component 11a is arranged on the flat surface, but the illustration thereof is omitted since the drawing will be complicated. In addition, a frame end surface water-sealing component 11b is arranged between the rear frame end surface 7d and the right frame end surface 8d. Moreover, a right frame flat surface water-sealing component 11c is arranged on the right frame top surface 8a and the right frame flat surface 8b. It should be noted that the right frame reverse surface 8m similarly includes a flat surface, and a right frame flat surface water-sealing component 11c is arranged on the flat surface, but the illustration thereof is omitted since the drawing will be complicated.

After the rear frame flat surface water-sealing components 11a, the frame end surface water-sealing component 11b, and the right frame flat surface water-sealing components 11c are arranged as described above, the rear frame 6f is moved in the direction of an arrow Y1 in FIG. 5A. As a result, the frame end surface water-sealing component 11b is sandwiched and fixed at the corner between the rear frame 6f and the right frame 6c. The rear frame 6f and the right frame 6c, between which the frame end surface water-sealing component 11b is interposed, are secured to each other at their corner by means of the screws 9 and 10 as shown in FIG. 5B. As a result, the frame end surface water-sealing component 11b is fixed between the rear frame end surface 7d and the right frame end surface 8d through the securing with the screws, and it is possible to completely water-seal the corner. It should be noted that only the one corner has been described above, but when the frames are secured by means of screws at all the corners, it is possible to completely water-seal the right frame 6c, the left frame 6d, the front frame 6e, and the rear frame 6f.

In addition, in FIG. 5B, the rear frame flat surface water-sealing component 11a is arranged on the rear frame flat surface 7b, and the right frame flat surface water-sealing component 11c is arranged on the right frame top surface 8a and the right frame flat surface 8b (see FIGS. 4A and 4B). A groove 6i (described later) is provided between the rear frame top surface 7a and the rear frame flat surface 7b. An outer peripheral portion of the rear frame flat surface water-sealing component 11a and an end portion (described later), on the rear frame flat surface water-sealing component 11a side, of the right frame flat surface water-sealing component 11c are inserted into the groove 6i. In addition, a groove 6i is provided on the reverse side of the rear frame flat surface 7b, and the other rear frame flat surface water-sealing component 11a and the other right frame flat surface water-sealing component 11c are inserted into the groove 6i.

After the securing with the screws as described above, the top frame 6a and the reverse frame 6b are assembled as shown in FIG. 5C. Specifically, the top frame 6a is moved in a downward direction Z toward the rear frame 6f and the right frame 6c and then moved in a direction X1 toward the rear frame 6f. In other words, the top frame 6a is moved in the direction of an arrow ZX1. By so doing, the rear frame flat surface water-sealing component 11a is arranged between the top frame 6a and the rear frame flat surface 7b in the groove 6i. In addition, the right frame flat surface water-sealing component 11c is also arranged between the top frame 6a and the rear frame flat surface 7b at its outer peripheral portion inserted into the groove 6i. Therefore, the parts of the rear frame flat surface water-sealing component 11a and the right frame flat surface water-sealing component 11c are allowed to completely water-seal the right frame 6c, the rear frame 6f, and the top frame 6a. Similarly, the reverse frame 6b is moved in the direction of an arrow ZX2 to the rear frame 6f and the right frame 6c, and thus it is possible to completely water-seal these frames. At the corner between the rear frame 6f and the left frame 6d, the above-described assembling is performed, whereby it is possible to completely water-seal the corner with respect to the top frame 6a and the reverse frame 6b. It should be noted that illustration of the groove 6i is omitted in the rear frame 6f in FIG. 5C, since the drawing will be complicated if the groove 6i is illustrated. In addition, a curved portion of the outer peripheral portion 6h inserted into the groove 6i provided in the rear frame 6f is omitted in each of the top frame 6a and the reverse frame 6b in FIG. 5C. Moreover, when the same assembling is performed at the two corners between the right frame 6c and the left frame 6d and the front frame 6e, it is possible to completely water-seal the frame 6 shown in FIG. 3D. However, the window 5a extends through the right frame 6c in FIG. 3D. Thus, when the window 5a is water-sealed as described later, it is possible to achieve complete water sealing of the frame 6.

[Assembling of Top Frame and Reverse Frame]

Figure 6A:
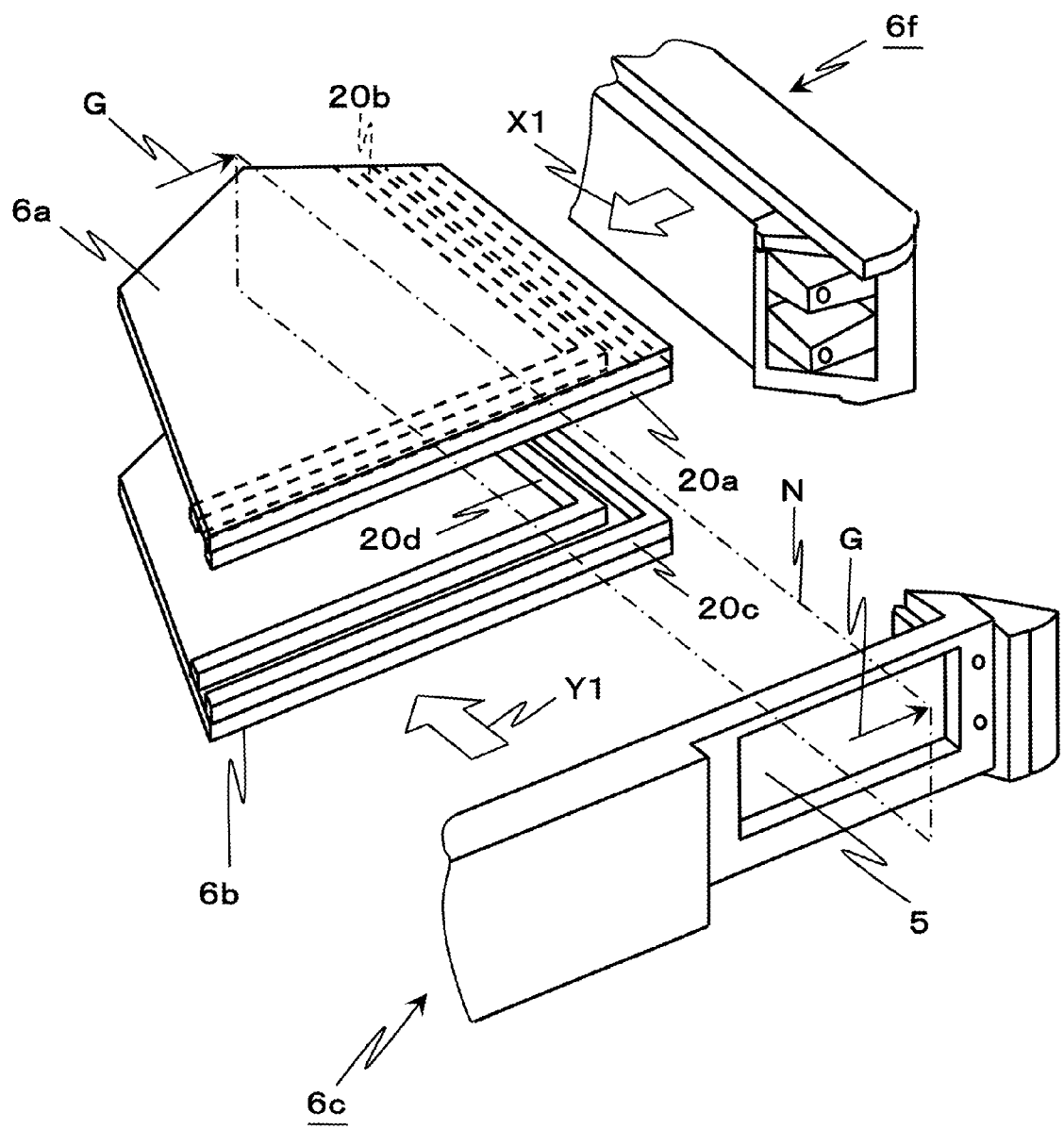
FIG. 6A is a principal part perspective view of the side frames in the operation casing of the PC prior to assembling.
Figure 6B:
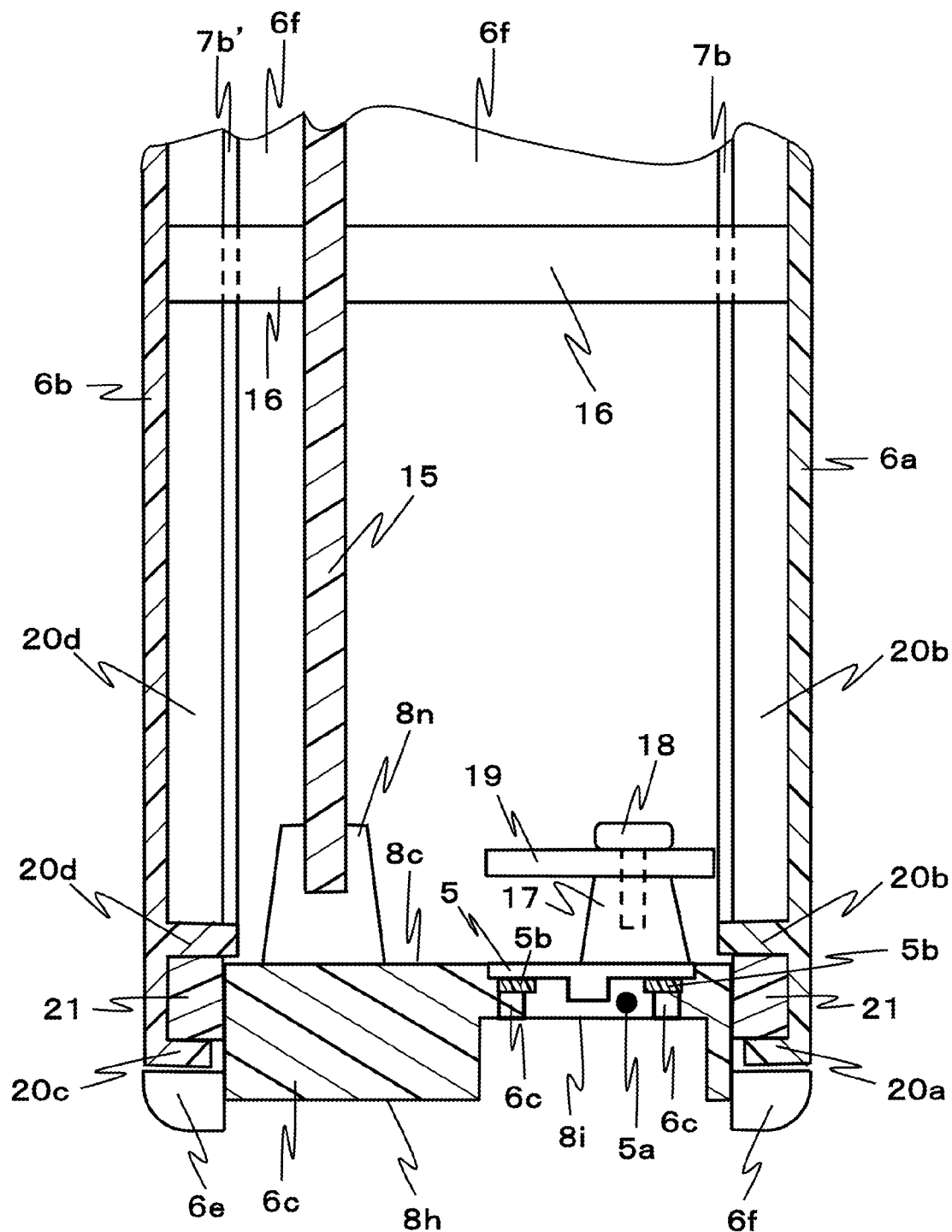
FIG. 6B is a principal part cross-sectional view of the side frames in the operation casing of the PC after assembling.

An example of assembling of the top frame 6a and the reverse frame 6b of the frame 6 will be described with reference to FIGS. 6A and 6B. FIG. 6A is an enlarged perspective view of the corner between the right frame 6c and the rear frame 6f as an example. FIG. 6B is a cross-sectional view taken along a plane N in FIG. 6A, as seen from arrows G. It should be noted that the same components as those in FIGS. 3A to 5C are designated by the same reference characters in FIGS. 6A and 6B.

A top frame inner wall 20b and a top frame outer wall 20a are arranged on a principal surface (an areally wide surface is referred to as "principal surface") of the top frame 6a which faces the reverse frame 6b across the right frame 6c, the left frame 6d, the front frame 6e, and the rear frame 6f. In addition, a water-sealing component 21 is inserted between the top frame inner wall 20b and the top frame outer wall 20a. A reverse frame inner wall 20d and a reverse frame outer wall 20c are arranged on a principal surface of the reverse frame 6b which faces the top frame 6a across the right frame 6c, the left frame 6d, the front frame 6e, and the rear frame 6f. Moreover, another water-sealing component 21 is inserted between the reverse frame inner wall 20d and the reverse frame outer wall 20c.

A boss 8n shown in FIG. 6B is provided so as to extend from the right frame inner surface 8c in a direction toward the left frame 6d, and a similar boss is provided on the inner surface of the left frame 6d. The boss 8n and the boss provided on the inner surface of the left frame 6d are able to retain a circuit board 15. As the method for retaining the circuit board 15 with the boss 8n, for example, mounting the circuit board 15 in a cut provided in the boss 8n (sandwiching the circuit board 15 with a cut of the boss on the left frame 6d facing the right frame 6c across the circuit board 15) or securing the circuit board 15 to the boss 8n by means of screws may be used. In the present embodiment, the circuit board 15 is sandwiched and fixed between cuts of the bosses provided on the right frame 6c and the left frame 6d. Since the right frame 6c, the left frame 6d, the front frame 6e, and the rear frame 6f which are inserted into each other are separate components, for example, it is possible to produce an auxiliary component, such as the boss 8n, on the right frame inner surface 8c. With this configuration, the function of the auxiliary component is exerted in assembling. Thus, this configuration is useful for, for example, reducing the number of components and shortening the assembling time period.

In addition, the connector 5 disposed inside the frame 6 is mounted inside the window 5a. The connector 5 is fixed to the periphery of the opening of the window 5a in the right frame 6c via a water-sealing component 5b by means of screws (not shown). The window 5a is water-sealed by the connector 5 and the water-sealing component 5b in this manner, and thus it is possible to obtain the frame 6 having water-sealing ability.

By securing the right frame 6c, the left frame 6d, the front frame 6e, and the rear frame 6f to each other by means of the screws 9 and 10 after the ribs at each corner are inserted to each other, a side portion as shown in FIG. 3C is assembled. Specifically, as shown in FIG. 6A, the rear frame 6f is moved in the direction of an arrow X1, and the right frame 6c is moved in the direction of an arrow Y1, thereby assembling the rear frame 6f and the right frame 6c. After the components constituting the side portion are assembled as described above, the top frame 6a and the reverse frame 6b are arranged on the upper side and the lower side of the side portion, thereby obtaining the frame 6 shown in FIG. 3D. It should be noted that the reason why the water-sealing component 21 is provided between the top frame inner wall 20b and the top frame outer wall 20a is to suppress lateral displacement of the water-sealing component 21 when the top frame 6a is moved in the direction of the arrow ZX1 as shown in FIG. 5C. Similarly, the reason why the other water-sealing component 21 is provided between the reverse frame inner wall 20d and the reverse frame outer wall 20c is to suppress lateral displacement of the water-sealing component 21 when the reverse frame 6b is moved in the direction of the arrow ZX2 as shown in FIG. 5C.

The water-sealing component 21 is provided between the top frame outer wall 20a and the top frame inner wall 20b arranged on the top frame 6a, and its surface is exposed in the direction to the reverse frame 6b. The water-sealing component 21 having such a configuration is pressed against the right frame inner surface 8c of the right frame 6c and becomes deformed. Due to this deformation, the top frame 6a and the right frame 6c are water-sealed. At the same time, the water-sealing component 21 provided between the top frame outer wall 20a and the top frame inner wall 20b is also pressed against the rear frame flat surface 7b and becomes deformed. Due to this deformation, the top frame 6a is water-sealed with respect to the rear frame 6f. In addition, the water-sealing component 21 is provided between the reverse frame outer wall 20c and the reverse frame inner wall 20d arranged on the reverse frame 6b. Thus, the water-sealing component 21 is pressed against the right frame inner surface 8c of the right frame 6c and becomes deformed. Due to this deformation, the reverse frame 6b is water-sealed with respect to the right frame 6c. At the same time, the water-sealing component 21 provided between the reverse frame outer wall 20c and the reverse frame inner wall 20d is also pressed against a rear frame flat surface 7b' and becomes deformed. Due to this deformation, the reverse frame 6b is water-sealed with respect to the rear frame 6f. Moreover, as described above, the window 5a is water-sealed by the water-sealing component 5b between the window 5a and the connector 5. Thus, it is possible to water-seal the frame 6 shown in FIG. 3D, by the water-sealing components 21 and 5b.

With such a water-sealing structure, it is possible to protect the circuit board 15 included in the frame 6, from water. In addition, the top frame 6a and the reverse frame 6b may also be assembled to, for example, an auxiliary frame 16 formed integrally with the rear frame 6f. The provision of such an auxiliary frame 16 allows the assembling of the top frame 6a and the reverse frame 6b to be easily performed. In addition, the provision of such an auxiliary frame 16 also allows the mechanical strength between the top frame 6a and the reverse frame 6b and the rear frame 6f to be enhanced. Therefore, it is possible to provide mechanical protection and protection against water to a portion where, for example, the included circuit board 15 or the connector 5 is connected to the frame 6.

In addition to the boss 8n, an auxiliary boss 17 for fixing the auxiliary circuit board 19, for example, by means of a screw 18 may be provided. As the auxiliary circuit board 19, for example, a circuit board on which a wireless communication circuit is mounted may be added as appropriate in accordance with the function of the PC. It should be noted that the auxiliary boss 17 may be provided on the left frame 6d, the front frame 6e, and/or the rear frame 6f, in addition to the inside of the right frame 6c. It is possible to easily mount the auxiliary circuit board 19 to the auxiliary boss 17 in the process in which the ribs of the right frame 6c, the left frame 6d, the front frame 6e, and the rear frame 6f, which are separate components, are inserted into each other at the corners therebetween and the right frame 6c, the left frame 6d, the front frame 6e, and the rear frame 6f are assembled.

In addition, by assembling of inserting the ribs at the corners between the right frame 6c, the left frame 6d, the front frame 6e, and the rear frame 6f, the outer peripheries of the ribs are engaged with each other as described above. In this case, by mutual interference between the ribs at each corner, it is possible to provide resistance to torsion applied in the up-down direction of the frame 6 and resistance to disengagement of the inserted portion. When the frames are secured to each other at each corner by means of screws, it is possible to make the inserted portion harder to disengage. In addition, the fastening force by the screws is added in the up-down direction of the frame 6 at the same time, and thus it is possible to enhance the mechanical robustness of the frame 6 against external forces applied in the up-down direction. Moreover, with the configuration with the interposed water-sealing components 21, it is possible to reliably water-seal the top frame 6a and the reverse frame 6b with respect to the right frame 6c, the left frame 6d, the front frame 6e, and the rear frame 6f. In addition, each of the corners between the right frame 6c, the left frame 6d, the front frame 6e, and the rear frame 6f is allowed to have reliable water-sealing ability by the insertion of the ribs and the interposition of the frame end surface water-sealing component 11b.

In addition, since the top frame outer wall 20a and the top frame inner wall 20b are provided on the top frame 6a, it is possible to enhance the mechanical strength of the top frame 6a. Therefore, for example, the top frame 6a is allowed to have resistance to bending of the top frame 6a. Moreover, the same applies to the reverse frame 6b. Therefore, it is possible to provide high robustness to the frame 6 shown in FIG. 3D. In the present embodiment, the configuration with the top frame outer wall 20a and the rear frame outer wall 20c has been described. However, for example, a step may be provided at the boundary between the rear frame top surface 7a and the rear frame flat surface 7b in the rear frame 6f and may be used instead of the top frame outer wall 20a. Therefore, it is possible to omit the top frame outer wall 20c. Similarly, it is also possible to omit the rear frame outer wall 20c.

In addition, it is also possible to make the top frame 6a and the reverse frame 6b into a thin shape by a simple method such as press molding. Therefore, it is also possible to decrease the thickness and the weight of the frame 6.

As described above, the present embodiment provides the simple configuration in which the right frame 6c, the left frame 6d, the front frame 6e, and the rear frame 6f are assembled by inserting the ribs at each corner therebetween and then the top frame 6a and the reverse frame 6b are assembled. Furthermore, with this configuration, it is possible to provide a lightweight and thin PC having excellent robustness and/or water-sealing ability.

In addition, the top frame 6a, the reverse frame 6b, the right frame 6c, the left frame 6d, the front frame 6e, and the rear frame 6f are formed as separate components. Therefore, it is possible to easily produce these components including additional components such as a boss, by molding. Moreover, it is possible to provide flexibility in designing molds used for molding. Since it is possible to freely control the thickness of each component, it is possible to decrease the thickness and the weight of the frame 6.

(Embodiment 2)

Figure 7A:
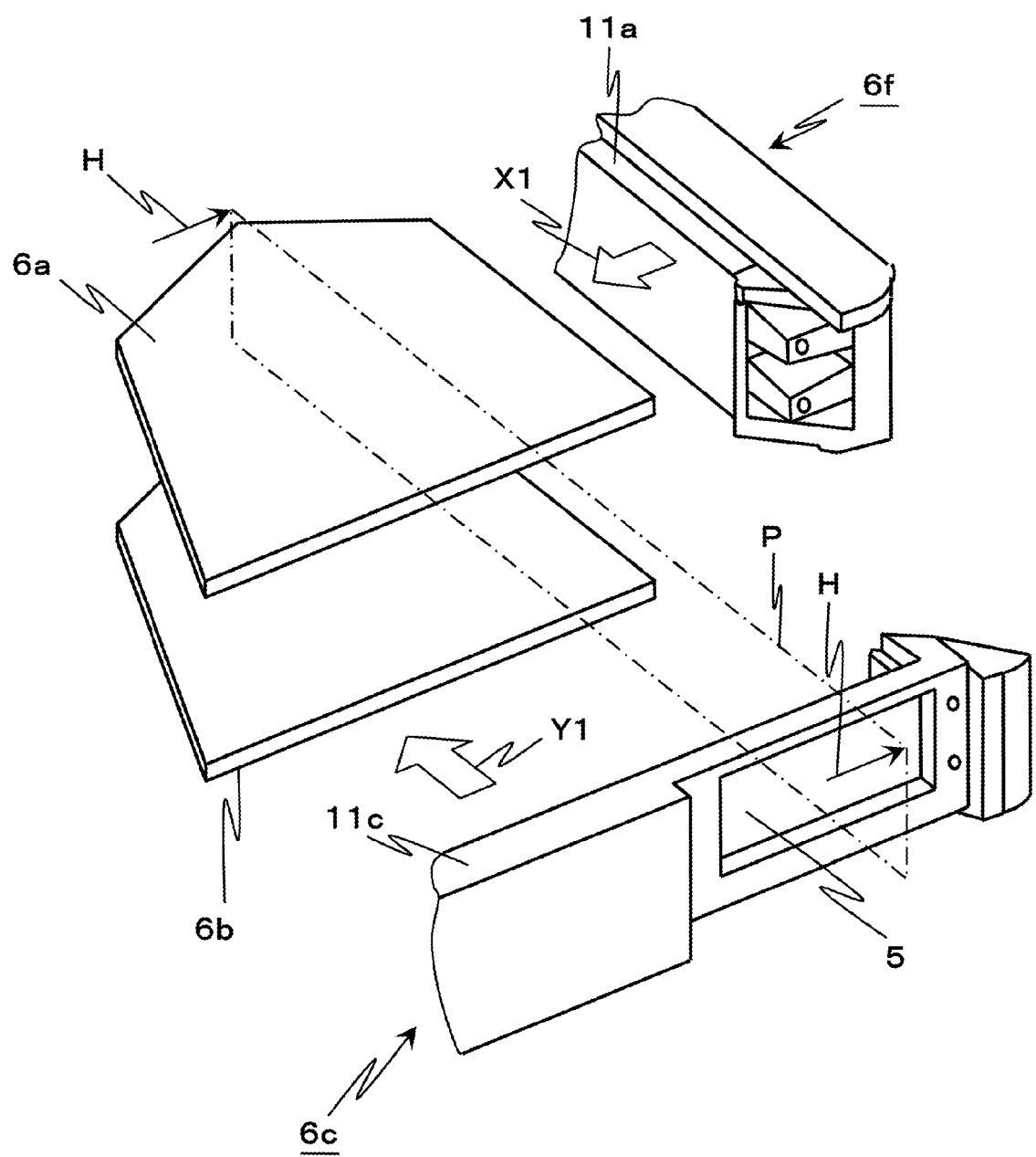
FIG. 7A is a principal part perspective view of side frames in an operation casing of another PC prior to assembling.
Figure 7B:
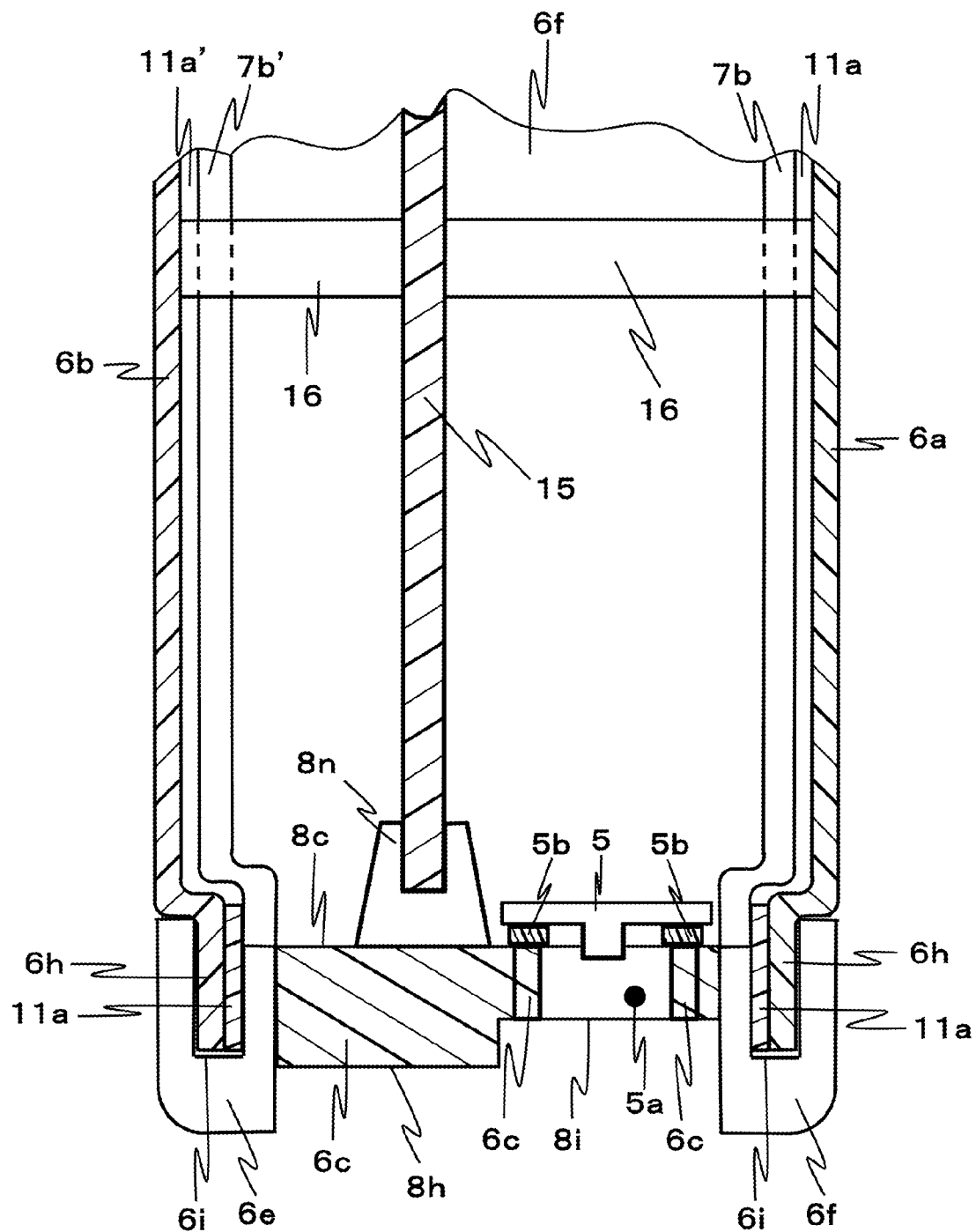
FIG. 7B is a principal part cross-sectional view of the side frames in the operation casing of the PC after assembling.

FIGS. 7A and 7B each show the configuration of a principal part of another PC. FIG. 7A is an enlarged perspective view of the vicinity of the corner between the right frame 6c and the rear frame 6f as an example. FIG. 7B is a cross-sectional view taken along a plane P in FIG. 7A, as seen from arrows H. It should be noted that the same components as those in FIGS. 3A to 5C are designated by the same reference characters in FIGS. 7A and 7B, and the description thereof is omitted.

[Assembling of Frame]

As shown in FIG. 7B, the outer peripheral portion 6h of the top frame 6a is inserted into a groove 6i provided in the right frame 6c. The outer peripheral portion 6h is bent in the direction from the principal surface of the top frame 6a to the reverse frame 6b so as to form a step. In addition, similarly, the outer peripheral portion 6h of the rear frame 6b is inserted into the groove 6i and bent in the direction from the principal surface of the reverse frame 6b to the top frame 6a so as to form a step. The groove 6i is provided between the rear frame top surface 7a and the rear frame flat surface 7b in the rear frame 6f. In addition, a groove 6i is also provided between a front frame top surface and a front frame flat surface 7b' in the front frame 6e. The outer peripheral portion 6h of the top frame 6 is arranged between the rear frame top surface 7a and the rear frame flat surface water-sealing component 11a in the groove 6i. With such a configuration, the rear frame flat surface water-sealing component 11a is allowed to water-seal the top frame 6a and the rear frame 6f at the corner.

It should be noted that the part of the rear frame flat surface water-sealing component 11a in the top frame 6a other than the corners is arranged between the rear frame flat surface 7b and the top frame 6a as shown in FIG. 7B. In other words, the groove 6i is also provided between the rear frame flat surface 7b and the rear frame top surface 7a similarly to the above-described corner, and the rear frame flat surface water-sealing component 11a and the outer peripheral portion 6h are inserted into the groove 6i. In addition, the part of a rear frame flat surface water-sealing component 11a' in the reverse frame 6b other than the corners is similarly arranged between the front frame flat surface 7b' and the reverse frame 6b. Therefore, the top frame 6a is water-sealed with respect to the rear frame flat surface 7b. In addition, the reverse frame 6b is water-sealed with respect to the rear frame flat surface 7b'. Moreover, also on the side of the left frame 6d which faces the right frame 6c across the circuit board 15 and the like, the front frame 6e and the rear frame 6f have the same configuration as described above and are allowed to be water-sealed. In addition, with the configuration in which the steps are provided in the top frame 6a and the reverse frame 6b, it is possible to provide resistance in the bending directions of the top frame 6a and the reverse frame 6b, and the mechanical strength of the top frame 6a and the reverse frame 6b is enhanced. It should be noted that since the assembling is performed by the insertion of the ribs into each other and the insertion into the grooves 6i as described above in Embodiment 1, it is also possible to omit the water-sealing components.

In addition, the top frame 6a and the reverse frame 6b are caused to face each other at an interval equal to the height of each of the right frame 6c, the left frame 6d, the front frame 6e, and the rear frame 6f. It should be noted that the rear frame flat surface water-sealing component 11a is arranged on the rear frame flat surface 7b. Similarly, the right frame flat surface water-sealing component 11c is arranged on the right frame top surface 8a and the right frame flat surface 8b. Similarly to Embodiment 1, the right frame 6c, the left frame 6d, the front frame 6e, and the rear frame 6f are inserted between the top frame 6a and the reverse frame 6b arranged thus, thereby obtaining the frame 6 shown in FIG. 3D.

It should be noted that the connector 5 of the present embodiment is provided in the window 5a via the water-sealing component 5b. The water-sealing structure for the connector 5 with respect to the window 5a is the same as shown in FIG. 6B in Embodiment 1. In addition, similarly to Embodiment 1, the auxiliary frame 16 is arranged. With this configuration, as described in Embodiment 1, it is possible to enhance ease of assembling the top frame 6a and the reverse frame 6b and the mechanical strength of the top frame 6a and the reverse frame 6b and provide mechanical resistance and high protection against water to components and the like included in the frame 6. Furthermore, it is possible to make the top frame 6a and/or the reverse frame 6b into a thin shape, and thus it is possible to decrease the weight of the frame 6.

In addition, the boss 8n for retaining the circuit board 15, the auxiliary boss 17 (see FIG. 6B) for supporting the auxiliary circuit board 19, and the like may be provided on the right frame 6c, the left frame 6d, the front frame 6e, and the rear frame 6f.

In addition, in the present embodiment, after the right frame 6c, the left frame 6d, the front frame 6e, and the rear frame 6f are assembled with mechanical strength, the top frame 6a and the reverse frame 6b are arranged, thereby forming the frame 6. The top frame 6a and the reverse frame 6b are inserted into the grooves 6i. Therefore, the top frame 6a is arranged along the depth direction of the facing groove 6i. As a result, the top frame 6a is retained in its principal surface direction in which its rigidity is high, and thus it is possible to further enhance the mechanical strength of the frame 6. In addition, the top frame 6a is inserted into the groove 6i in the direction in which its rigidity is high. Therefore, for example, when a water-sealing component (the rear frame flat surface water-sealing component 11a, the right frame flat surface water-sealing component 11c, etc.) is provided between the bottom of the groove 6i and the outer peripheral portion 6h, it is possible to achieve simplification and reliability of the water-sealing structure. The same applies to the reverse frame 6b. In addition, it is possible to omit retaining components such as screws for retaining the top frame 6a and the reverse frame 6b.

(Embodiment 3)

Figure 8A:
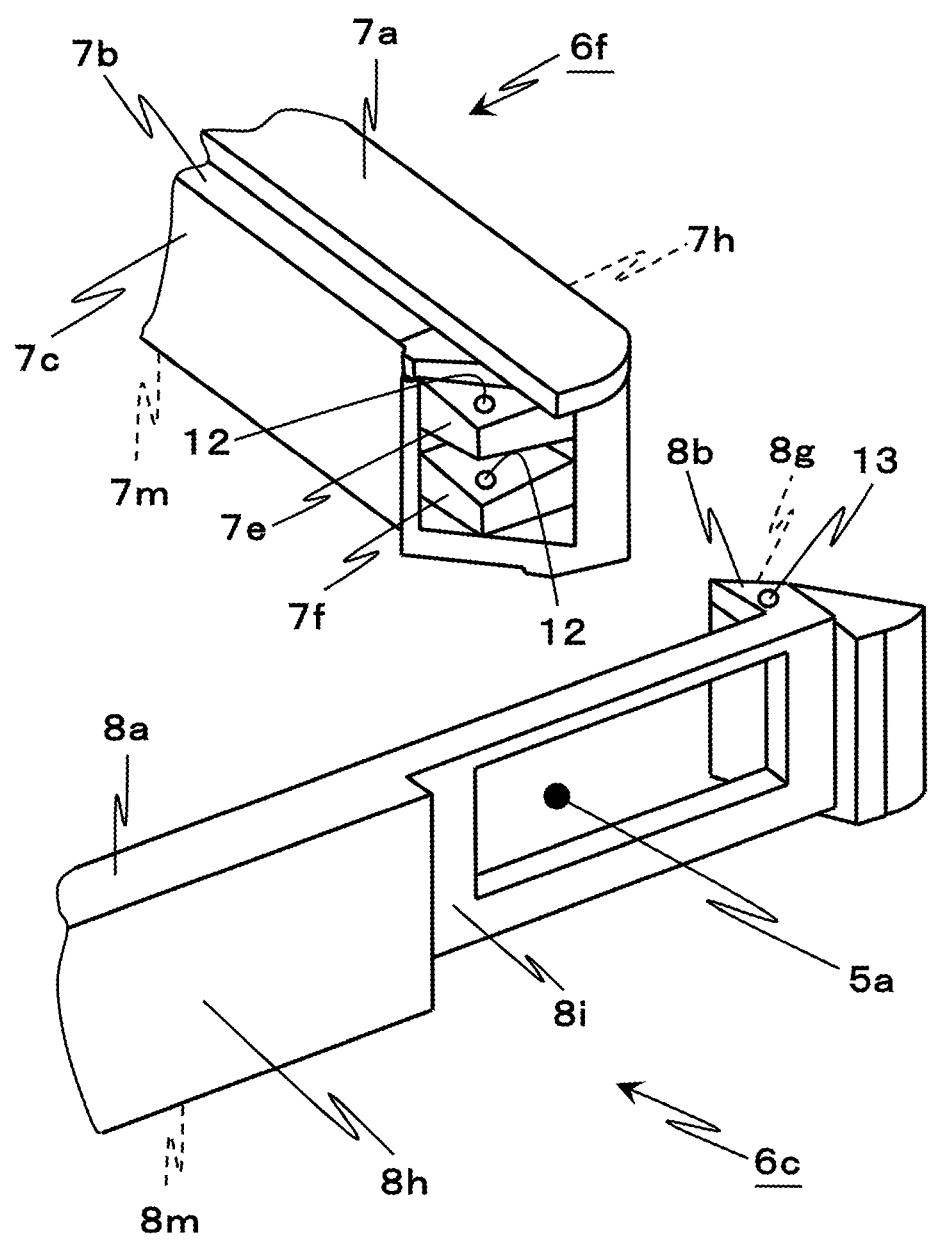
FIG. 8A is a principal part perspective view in an operation casing of another PC prior to assembling.
Figure 8B:
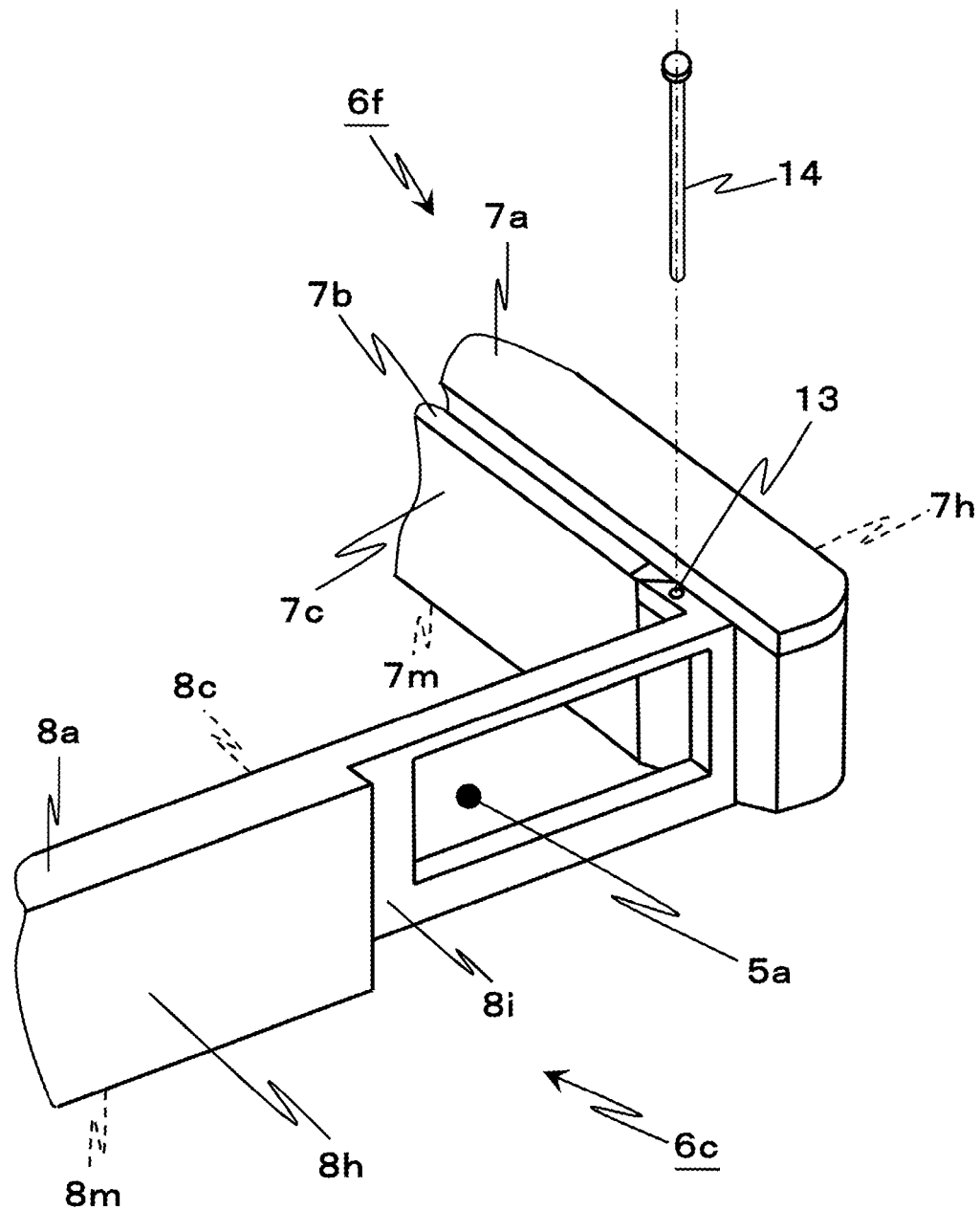
FIG. 8B is a principal part perspective view in the operation casing of the PC after assembling.

FIGS. 8A and 8B each show the configuration of a principal part of another PC. FIGS. 8A and 8B are enlarged perspective views of the vicinity of the corner between the right frame 6c and the rear frame 6f as an example. It should be noted that the same components as those in FIGS. 3A to 5C are designated by the same reference characters in FIGS. 8A and 8B, and the description thereof is omitted.

[Configuration of Securing Frames by Screws]

Rear frame screw holes 12 through which a later-described screw 14 is to extend are provided in the rear frame upper rib 7e and the rear frame lower rib 7f of the rear frame 6f. In addition, right frame screw holes 13 into which the screw 14 is to be inserted are provided in the right frame flat surface 8b and the right frame reverse surface 8m of the right frame 6c and near the right frame projection end surface 8g. It should be noted that the screw 14 is screwed into at least the right frame screw hole 13 on the right frame reverse surface 8m side.

The rear frame upper rib 7e and the rear frame lower rib 7f and the right frame upper rib 8e (see FIGS. 4B and 4D) and the right frame lower rib 8f (see FIGS. 4B and 4D) of the right frame 6c are inserted into each other to fit together the rear frame 6f and the right frame 6c shown in FIG. 8B. In this state, the screw 14 is inserted and screwed into the right frame screw hole 13 on the right frame reverse surface 8m side in a direction perpendicular to the rear frame top surface 7a and the right frame top surface 8a.

With this configuration, the screw 14 secures the right frame flat surface 8b, the rear frame upper rib 7e, the right frame upper rib 8e, the rear frame lower rib 7f, the right frame lower rib 8f, and the right frame reverse surface 8m. Therefore, it is possible to fix the right frame 6c and the rear frame 6f to each other by means of the single screw 14. It should be noted that the corner between the right frame 6c and the rear frame 6f has been described above, but it is possible to similarly fix the frames also at all the corners, and it is possible to provide the frame 6 having excellent mechanical strength. In addition, since it is possible to fix the right frame 6c and the rear frame 6f to each other by means of the single screw 14, it is possible to reduce the screwing operation as compared to the configuration of securing at each corner by means of a plurality of screws. Furthermore, the screw securing is made within the frame 6, and thus it is possible to improve the appearance of the operation casing 2.

It should be noted that the screw 14 is arranged perpendicular to the rear frame top surface 7a and the right frame top surface 8a when securing, but may be arranged so as to be inclined relative to the rear frame top surface 7a and the right frame top surface 8a when securing.

[Appended Notes]

As presented above, the embodiments have been described as examples of the technology according to the present disclosure. For this purpose, the accompanying drawings and the detailed description are provided.

Therefore, components in the accompanying drawings and the detail description may include not only components essential for solving problems, but also components that are provided to illustrate the above described technology and are not essential for solving problems. Therefore, such inessential components should not be readily construed as being essential based on the fact that such inessential components are shown in the accompanying drawings or mentioned in the detailed description.

Further, the above described embodiments have been described to exemplify the technology according to the present disclosure, and therefore, various modifications, replacements, additions, and omissions may be made within the scope of the claims and the scope of the equivalents thereof.

It should be noted that the outer shape of the electronic apparatus of the present disclosure is a rectangular parallelepiped shape as an example in the above description but is not limited thereto. In addition, the top frame is an example of a first plate in the present disclosure; the reverse frame is an example of a second plate in the present disclosure; and the right frame, the left frame, the front frame, and the rear frame are an example of a plurality of frames in the present disclosure.

In addition, each rib in the present disclosure is a concept of a relative projection.

It should be noted that each screw is an example of a fastening component in the present disclosure. As the fastening component, other than the screw, an adhesive or a so-called tack such as a rivet may be used.

The electronic apparatus of the present disclosure is used as, for example, a portable computer, a game apparatus, a mobile phone, a camera, a television, or the like.

What is claimed is:

1. An electronic apparatus, comprising:
    a first substantially rectangular planar plate;
    a second substantially rectangular planar plate facing the first plate so as to be spaced apart therefrom in a first direction; and
    a plurality of frames arranged between the first plate and the second plate to form a side surface, wherein
    each frame includes a plurality of ribs, and
    the ribs of each frame are arranged so as to overlap in the first direction alternately with the ribs of another frame adjacent to the frame, and corners of each frame interlocking with corners of another frame by the overlapping of the ribs, thereby forming a rectangular ring-like structure capable of standing by itself.

2. The electronic apparatus according to claim 1, wherein the ribs of each frame are fastened to the ribs of another frame adjacent to the frame, by means of a fastening component extending through a perimeter side of each frame, the ribs of each frame, and the ribs of the another frame.

3. The electronic apparatus according to claim 1, wherein ends of the ribs of each frame are in contact with another frame adjacent to the frame, within the other frame, and are fastened thereto by means of fastening components from an outside of the other frame.

4. The electronic apparatus according to claim 1, wherein each rib is in contact with the first plate or the second plate via a water-sealing component.

5. The electronic apparatus according to claim 1, wherein the electronic apparatus retains a circuit board therein, and the circuit board is retained by bosses formed inside the plurality of frames.

6. The electronic apparatus according to claim 1, wherein the electronic apparatus comprises four frames.

7. The electronic apparatus according to claim 1, wherein the ribs of each frame and the ribs of another frame adjacent to the frame engage such that the frame and the another frame are interlocked.

* * * * *